(12) United States Patent
Maeda et al.

(10) Patent No.: US 11,049,749 B2
(45) Date of Patent: Jun. 29, 2021

(54) SUBSTRATE TREATING APPARATUS

(71) Applicant: SCREEN Holdings Co., Ltd., Kyoto (JP)

(72) Inventors: Masafumi Maeda, Kyoto (JP); Masaki Nishida, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/554,816

(22) Filed: Aug. 29, 2019

(65) Prior Publication Data

US 2020/0098610 A1 Mar. 26, 2020

(30) Foreign Application Priority Data

Sep. 21, 2018 (JP) ............................. JP2018-178010

(51) Int. Cl.
 *H01L 21/677* (2006.01)
 *H01L 21/67* (2006.01)

(52) U.S. Cl.
 CPC .... *H01L 21/67745* (2013.01); *H01L 21/6715* (2013.01); *H01L 21/6776* (2013.01); *H01L 21/67178* (2013.01); *H01L 21/67276* (2013.01); *H01L 21/67754* (2013.01)

(58) Field of Classification Search
 CPC ......... H01L 21/67745; H01L 21/67276; H01L 21/67754
 See application file for complete search history.

(56) References Cited

U.S. PATENT DOCUMENTS

| 10,181,417 | B2* | 1/2019 | Kokabu | ............ H01L 21/67754 |
| 10,373,852 | B2* | 8/2019 | Yamamoto | ............. B08B 3/041 |
| 2006/0147201 | A1 | 7/2006 | Asano et al. | |
| 2006/0245855 | A1* | 11/2006 | Hamada | ............. H01L 21/6715 414/217 |
| 2009/0000543 | A1 | 1/2009 | Fukutomi et al. | ............... 118/58 |
| 2009/0025155 | A1 | 1/2009 | Nishiyama et al. | ........... 15/21.1 |
| 2010/0326353 | A1* | 12/2010 | Akimoto | ........... H01L 21/67184 118/620 |

(Continued)

FOREIGN PATENT DOCUMENTS

| JP | 2009-010291 A | 1/2009 |
| JP | 2017-163103 A | 9/2017 |

(Continued)

OTHER PUBLICATIONS

Office Action dated Jun. 9, 2020 for corresponding Taiwan Patent Application No. 108130574.

(Continued)

*Primary Examiner* — Kaitlin S Joerger
(74) *Attorney, Agent, or Firm* — Ostrolenk Faber LLP

(57) ABSTRACT

A substrate treating apparatus includes an indexer, a first processing section, a first transport mechanism, a second processing section, a second transport mechanism, a first mount table, a second mount table, and a controller. The first transport mechanism repeatedly performs a first cycle operation composed of three access operations (specifically, a first access operation, a second access operation, and a third access operation). The second transport mechanism repeatedly performs a second cycle operation composed of three access operations (specifically, a fourth access operation, a fifth access operation, and a sixth access operation).

18 Claims, 19 Drawing Sheets

(56) References Cited

U.S. PATENT DOCUMENTS

| | | | |
|---|---|---|---|
| 2011/0132260 A1* | 6/2011 | Yamazaki | H01L 21/67745 118/719 |
| 2012/0084059 A1* | 4/2012 | Akada | H01L 21/67225 702/188 |
| 2014/0044502 A1* | 2/2014 | Uemura | H01L 21/67745 414/217 |
| 2014/0216658 A1 | 8/2014 | Minami et al. | 156/345.31 |
| 2016/0320713 A1* | 11/2016 | Mori | G03F 7/70991 |
| 2017/0263491 A1 | 9/2017 | Muramoto | |
| 2017/0336711 A1 | 11/2017 | Yamada | |
| 2019/0013220 A1* | 1/2019 | Muramoto | H01L 21/67184 |
| 2019/0025700 A1* | 1/2019 | Oh | H01L 21/67051 |
| 2020/0098602 A1* | 3/2020 | Inagaki | H01L 21/67745 |
| 2020/0098609 A1* | 3/2020 | Kuwahara | H01L 21/67766 |
| 2020/0098610 A1* | 3/2020 | Maeda | H01L 21/67754 |
| 2020/0098611 A1* | 3/2020 | Kuwahara | H01L 21/67772 |
| 2020/0206788 A1* | 7/2020 | Kuwahara | H01L 21/67733 |
| 2020/0211868 A1* | 7/2020 | Kuwahara | H01L 21/67276 |

FOREIGN PATENT DOCUMENTS

| | | |
|---|---|---|
| KR | 10-2006-0063683 A | 6/2006 |
| KR | 10-2006-011469 A | 11/2006 |
| KR | 10-2017-0105426 A | 9/2017 |
| TW | 200913028 A | 3/2009 |
| TW | 201250915 A | 12/2012 |
| TW | 201330158 A | 7/2013 |
| TW | 201624146 A | 7/2016 |
| TW | 201736232 A | 10/2017 |

OTHER PUBLICATIONS

Office Action dated Nov. 27, 2020 for corresponding Korean Patent Application No. 10-2019-0107315.

Notice of Allowance dated Mar. 29, 2021 for corresponding Korean Patent Application No. 10-2019-0107315.

\* cited by examiner

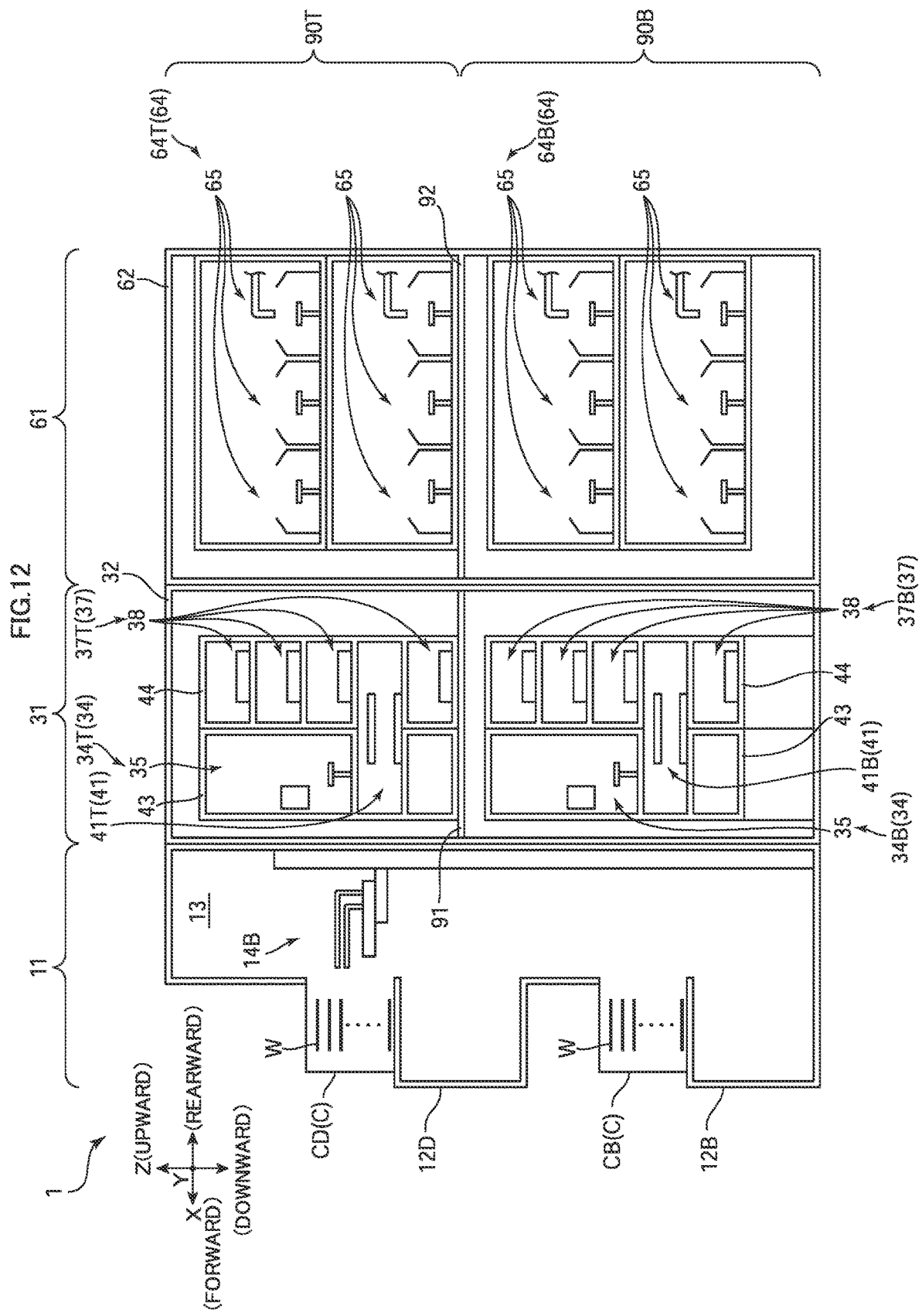

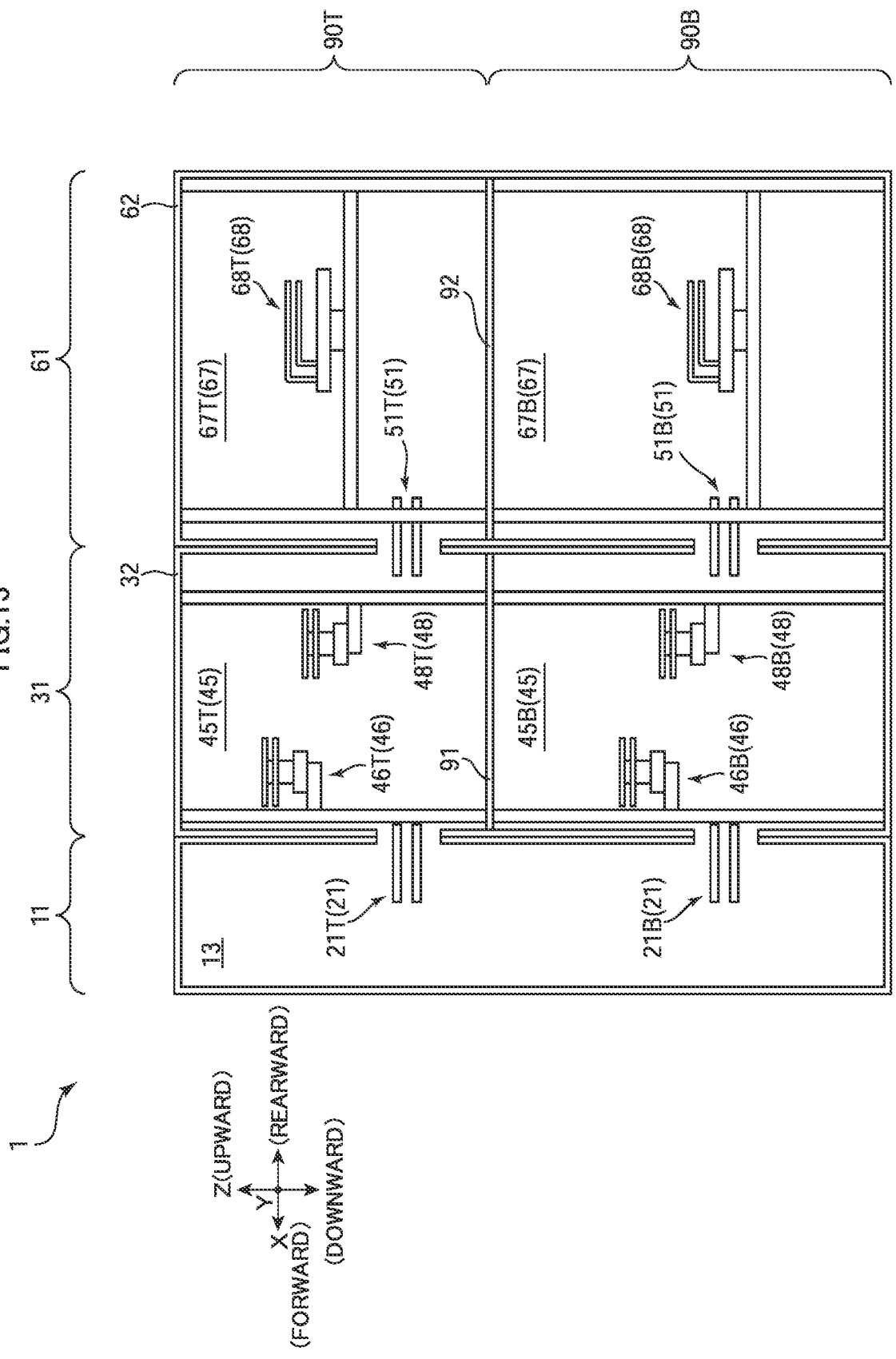

SUBSTRATE TREATING APPARATUS

CROSS-REFERENCE TO RELATED APPLICATIONS

This application claims priority to Japanese Patent Application No. 2018-178010 filed Sep. 21, 2018, the disclosure of which is hereby incorporated herein by reference in its entirety for all purposes.

BACKGROUND OF THE INVENTION

Field of the Invention

The present invention relates to a substrate treating apparatus that performs treatment to substrates. Examples of the substrates include a semiconductor wafer, a substrate for liquid crystal display, a substrate for organic electroluminescence (EL), a substrate for flat plasma display (FPD), a substrate for optical display, a magnetic disk substrate, a magneto-optical disk substrate, a substrate for photomask, and a solar cell substrate.

Description of the Related Art

Japanese Unexamined Patent Publication No. 2009-010291A discloses a substrate treating apparatus. Hereinunder, numerals in Japanese Unexamined Patent Publication Application No. 2009-010291A are expressed in parentheses. A substrate treating apparatus (1) includes a transport mechanism (TID), a transport mechanism (T1), a transport mechanism (T2), and a transport mechanism (TIFA). The transport mechanisms (TID, T1, T2, TIFA) each transport a substrate.

The substrate treating apparatus (1) further includes a mount table (PASS1), a mount table (PASS2), and a mount table (PASS5). The mount tables (PASS1, PASS2, PASS5) each receive the substrate. The transport mechanism (TID) and the transport mechanism (T1) reciprocally transfer the substrate W via the mount table (PASS1). The transport mechanism (T1) and the transport mechanism (T2) reciprocally transfer the substrate W via the mount table (PASS2). The transport mechanism (T2) and the transport mechanism (TIFA) reciprocally transfer the substrate W via the mount table (PASS5).

The substrate treating apparatus (1) includes a coating unit (31), a heat treating unit (41), an edge exposing unit (EEW), a developing unit (DEV), and a heat treating unit (42). The coating unit (31), the heat treating unit (41), the edge exposing unit (EEW), the developing unit (DEV), and the heat treating unit (42) each treat substrates. The transport mechanism (T1) transports the substrate to the coating unit (31) and the heat treating unit (41). The transport mechanism (T2) transports the substrate to the edge exposing unit (EEW), the developing unit (DEV), and the heat treating unit (42).

The transport mechanism (T1) performs a series of operations (hereinunder, referred to as "cycle operation") repeatedly. The cycle operation performed by the transport mechanism (T1) includes at least four access operations as under:
First access operation: access to the mount table (PASS1)
Second access operation: access to the mount table (PASS2)
Third access operation: access to the coating unit (31)
Fourth access operation: access to the heat treating unit (41)

The transport mechanism (T2) performs a series of operations (hereinunder, referred to as "cycle operation") repeatedly. The cycle operation performed by the transport mechanism (T2) includes at least five access operations as under:
Fifth access operation: access to the mount table (PASS2)
Sixth access operation: access to the mount table (PASS5)
Seventh access operation: access to the edge exposing unit (EEW)
Eighth access operation: access to the developing unit (DEV)
Ninth access operation: access to the heat treating unit (42)

The substrate treating apparatus (1) includes a transportation space (A1) and a transportation space (A2). The transportation space (A1) is disposed laterally of the coating unit (31) and the heat treating unit (41). The transport mechanism (T1) is disposed in the transportation space (A1). The transportation space (A2) is disposed laterally of the edge exposing unit (EEW), the developing unit (DEV), and the heat treating unit (42). The transport mechanism (T2) is disposed in the transportation space (A2). The mount table (PASS2) is arranged across the transportation space (A1) and the transportation space (A2).

SUMMARY OF THE INVENTION

It is required to obtain more enhanced throughput (the number of substrates capable of undergoing treatment per unit time) of the substrate treating apparatus. However, the configuration of the substrate treating apparatus (1) described in Japanese Unexamined Patent Application No. 2009-010291 has difficulty in obtaining the more enhanced throughput.

It is also required to obtain more reduced footprint (installation area) of the substrate treating apparatus. However, the configuration of the substrate treating apparatus (1) described in Japanese Unexamined Patent Application No. 2009-010291 has difficulty in more reduction in footprint of the substrate treating apparatus (1).

The present invention has been made regarding the state of the art noted above, and its primary object is to provide a substrate treating apparatus that allows enhanced throughput. Moreover, its secondary object is to provide a substrate treating apparatus that allows lowered footprint of the substrate treating apparatus.

The present invention is constituted as stated below to achieve the above object.

One aspect of the present invention provides a substrate treating apparatus. The substrate treating apparatus includes an indexer that unloads a substrate from a carrier, a first processing section that performs treatment to the substrate, a first transport mechanism that transports the substrate to the first processing section, a second processing section that performs treatment, different from the treatment by the first processing section to the substrate, a second transport mechanism that transports the substrate to the second processing section; a first mount table on which the substrate transported between the indexer and the first transport mechanism is placed, a second mount table on which the substrate transported between the first transport mechanism and the second transport mechanism is placed, and a controller that performs control to the indexer, the first processing section, the first transport mechanism, the second processing section, and the second transport mechanism. The first transport mechanism repeatedly performs first cycle operation composed of three access operations in accordance with the control by the controller, one of the access operations in the first cycle operation is a first access operation of accessing the first mount table, another of the access operations in the first cycle operation is a second access operation of accessing the first processing section, and the other of the access operations in the first cycle operation is a third access operation of accessing the second mount table, the second transport mechanism repeatedly performs second cycle operation composed of two or three access operations in accordance with the control by the controller, one of the access operations in the second cycle operation is a fourth access operation of accessing the second mount table, and another of the access operations in the second cycle operation is a fifth access operation of accessing the second processing section.

The substrate is transported between the indexer and the first transport mechanism via the first mount table. The substrate is transported between the first transport mechanism and the second transport mechanism via the second mount table. The first transport mechanism transports the substrate to the first processing section. The second transport mechanism transports the substrate to the second processing section. The first processing section and the second processing section each perform the treatment to the substrate. The treatment to the substrate by the second processing section is different from the treatment by the first processing section.

Here, the first transport mechanism repeatedly performs the first cycle operation in accordance with the control by the controller. The first cycle operation is composed of only three access operations. In other words, the number of access operations included in the first cycle operation is three. Specifically, the access operations included in the first cycle operation is the first access operation, the second access operation, and the third access operation. As noted above, the number of access operations included in the first cycle operation is relatively small. Accordingly, the frequency of cycle operation performable per unit time by the first transport mechanism is relatively large. In other words, the number of substrates transportable per unit time by the first transport mechanism is relatively large. That is, the first transport mechanism transports the substrates at relatively high efficiency (hereinafter, referred to as "transportation efficiency" appropriately).

Here, the second first transport mechanism repeatedly performs the second cycle operation in accordance with the control by the controller. The second cycle operation is composed of only two or three access operations. In other words, the number of access operations included in the second cycle operation is two or three. Specifically, the access operations included in the second cycle operation is the fourth access operation and the fifth access operation. As noted above, the number of access operations included in the second cycle operation is relatively small. Accordingly, relatively high transportation efficiency by the second transport mechanism is obtainable.

As described above, since the first and second transport mechanisms each have the relatively high transportation efficiency, the number of substrates per unit time capable of treated by the substrate treating apparatus is relatively large. This achieves suitably enhanced throughput of the substrate treating apparatus.

In the above-described substrate treating apparatus, the first access operation includes operation by the first transport mechanism of picking up the substrate on the first mount table and placing the substrate onto the first mount table, the second access operation includes operation by the first transport mechanism of loading the substrate into the first processing section and unloading the substrate from the first processing section, the third access operation includes operation by the first transport mechanism of picking up the substrate on the second mount table and placing the substrate onto the second mount table, the fourth access operation includes operation by the second transport mechanism of picking the substrate on the second mount table and placing the substrate onto the second mount table, and the fifth access operation includes operation by the second transport mechanism of loading the substrate into the second processing section and unloading the substrate from the second processing section. Such is preferable. With such a configuration, the first transport mechanism and the second transport mechanism are capable of transporting the substrate, supplied from the indexer, to the first processing section and the second processing section. Moreover, the first transport mechanism and the second transport mechanism are capable of transporting the substrate, subjected to the treatment by the first processing section and the second processing section, back to the indexer.

In the substrate treating apparatus described above, it is preferred that the first processing section is disposed out of a second area where the second transport mechanism is capable of transporting the substrate, and the second processing section is disposed out of a first area where the first transport mechanism is capable of transporting the substrate. The first processing section is disposed out of the second area of the second transport mechanism. Accordingly, the first transport mechanism is capable of accessing the first processing section without any interference with the second transport mechanism. Likewise, the second processing section is disposed out of the first area of the first transport mechanism. Accordingly, the second transport mechanism is capable of accessing the second processing section without any interference with the first transport mechanism.

It is preferred in the substrate treating apparatus mentioned above that the first area is substantially circular in plan view, and the second area is substantially circular in plan view. Since the first area is substantially circular in plan view, the first transport mechanism is capable of performing the three access operations in the first cycle operation efficiently. In other words, the first transport mechanism is capable of performing the first cycle operation efficiently. Accordingly, much higher transportation efficiency by the first transport mechanism is obtainable. Likewise, since the second area is substantially circular in plan view, the second transport mechanism is capable of performing the two or three access operations in the second cycle operation efficiently. In other words, the second transport mechanism is capable of performing the second cycle operation efficiently. Accordingly, much higher transportation efficiency by the second transport mechanism is obtainable.

In the above-described substrate treating apparatus, the first mount table is disposed between the indexer and the first transport mechanism, the second mount table is disposed between the first transport mechanism and the second transport mechanism, the first processing section is disposed laterally of the first transport mechanism, and the second processing section is disposed laterally of the second transport mechanism. Such is preferable. The first mount table is disposed between the indexer and the first transport mechanism. Accordingly, the indexer and the first transport mechanism allow easy access to the first mount table. The second mount table is disposed between the first transport mechanism and the second transport mechanism. Accordingly, the first transport mechanism and the second transport mechanism allow easy access to the second mount table. The first processing section is disposed laterally of the first transport mechanism. Accordingly, the first transport mechanism allows easy access to the first processing section. The second processing section is disposed laterally of the second transport mechanism. Accordingly, the second transport mechanism allows easy access to the second processing section.

It is preferred in the substrate treating apparatus mentioned above that the first transport mechanism, the second transport mechanism, and the second mount table are arranged in a triangle shape in plan view. This causes the first transport mechanism, the second transport mechanism, and the second mount table to be arranged on a vertex of the triangle, respectively, in plan view. Accordingly, a distance between the first transport mechanism and the second transport mechanism can be reduced. Therefore, this achieves a small installation area (footprint) of the substrate treating apparatus.

In the above-described substrate treating apparatus, the first transport mechanism includes a first strut that is fixedly arranged and extends in an upward/downward direction, a first lifting member that is supported on the first strut and is movable in the upward/downward direction, a first rotator that is supported on the first lifting member and is rotatable around a first axis parallel to the upward/downward direction, and a first holder that is supported on the first rotator and holds the substrate, the first rotator being immovable in a horizontal direction, the first processing section including a plurality of first processing units that performs treatment to each of the substrates, the first processing units each overlapping the first axis in side view, the second transport mechanism includes a second strut that is fixedly arranged and extends in the upward/downward direction, a second lifting member that is supported on the second strut and is movable in the upward/downward direction, a second rotator that is supported on the second lifting member and is rotatable around a second axis parallel to the upward/downward direction, and a second holder that is supported on the second rotator and holds the substrate, the second rotator being immovable in the horizontal direction, the second processing section including a plurality of second processing units that performs treatment to each of the substrates, the second processing units being positioned so as to overlap the second axis in side view. Such is preferable. The first strut is fixedly arranged. The first rotator is immovable in the horizontal direction. Accordingly, the first transport mechanism is capable of performing the first to third access operations individually in a short time. Moreover, the first processing units are positioned so as to overlap the first axis in side view. Accordingly, the first transport mechanism allows easy access to the first processing units. Likewise, the second strut is fixedly arranged. The second rotator is immovable in the horizontal direction. Accordingly, the second transport mechanism is capable of performing the fourth and fifth access operations individually in a short time. Moreover, the second processing units are positioned so as to overlap the second axis in side view. Accordingly, the second transport mechanism allows easy access to the second processing units.

In the substrate treating apparatus described above, it is preferred that either the first processing units or the second processing units are heat treating units for performing a heat treatment to the substrates, and the heat treating units are arranged in the upward/downward direction. Since the heat treating units are arranged in the upward/downward direction, either the first transport mechanism or the second transport mechanism allows easy access to the heat treating units individually. For instance, if the first processing units correspond to the heat treating units, the first transport mechanism allows easy access to the heat treating units individually. For instance, if the second processing units correspond to the heat treating units, the second transport mechanism allows easy access to the heat treating units individually.

It is preferred in the substrate treating apparatus mentioned above that a distance between the first axis and the second axis is five times or less a radius of the substrate in plan view. Accordingly, the distance between the first transport mechanism and the second transport mechanism can be reduced. Therefore, this achieves a small installation area (footprint) of the substrate treating apparatus.

It is preferred in the substrate treating apparatus mentioned above that the second mount table is positioned so as not to overlap a virtual line that connects the first axis to the second axis in plan view. Accordingly, the distance between the first transport mechanism and the second transport mechanism can be reduced suitably.

It is preferred in the substrate treating apparatus mentioned above that a distance between the first axis and the second mount table is substantially equal to a distance between the second axis and the second mount table in plan view. Accordingly, the first transport mechanism and the second transport mechanism allow easy access to the second mount table.

It is preferred in the substrate treating apparatus mentioned above that the second mount table includes a first portion overlapped on the first processing section in plan view and a second portion overlapped on the second processing section in plan view. The second mount table is positioned so as to overlap both the first processing section and the second processing section in plan view. Accordingly, both reduction in distance between the first transport mechanism and the second transport mechanism and easy access of the first and second transport mechanisms to the second mount table are suitably established.

It is preferred in the substrate treating apparatus mentioned above that second mount table further includes a third portion not overlapped on the first processing section and the second processing section in plan view. Accordingly, the first and second transport mechanisms are capable of accessing the second mount table more easily.

In the substrate treating apparatus described above, it is preferred that the third portion of the second mount table is overlapped in plan view on a transportation space where the first and second transport mechanisms are arranged. Accordingly, the first and second transport mechanisms are capable of accessing the second mount table more easily.

It is preferred that the substrate treating apparatus described above further includes a plurality of first slots that are arranged laterally of the first transport mechanism in line in an upward/downward direction, and a plurality of second slots that are arranged laterally of the second transport mechanism in line in the upward/downward direction, at least one of the first slots being a first treatment slot for arranging the first processing section and another of the first slots being a first mounting slot for arranging the second mount table, at least one of the second slots being a second treatment slot for arranging the second processing section and another of the second slots being a second mounting slot for arranging the second mount table, the second mounting slot being dispose at a level equal to that of the first mounting slot, and the second mount table being arranged over the first mounting slot and the second mounting slot. Accordingly, the second mount table is arrangeable suitably with a part of the first slots and a part of the second slots.

It is preferred that the substrate treating apparatus described above further includes a third processing section that performs different treatment from the treatment by the first processing section and the treatment by the second processing section, and a third transport mechanism that transports the substrate to the third processing section, and a third mount table on which the substrate transported between the second transport mechanism and the third transport mechanism is placed, wherein the controller performs additional control of the third processing section and the third transport mechanism, the second cycle operation being composed of three access operations, rest one of the access operations in the second cycle operation other than the fourth access operation and the fifth access operation is a sixth access operation of accessing the third mount table, the third transport mechanism repeatedly performs the third cycle operation composed of two or three access operations in accordance with the control by the controller, one of the access operations in the third cycle operation is a seventh access operation of accessing the third mount table, and another of the access operations in the third cycle operation is an eighth access operation of accessing the third processing section.

The substrate is transported between the second transport mechanism and the third transport mechanism via the third mount table. The third transport mechanism transports the substrate to the third processing section. The third processing section performs treatment to the substrate. The treatment to the substrate by the third processing section is different from the treatment by the first processing section and the treatment by the second processing section.

Here, the second cycle operation by the second transport mechanism is composed of only three access operations. In other words, the number of access operations included in the second cycle operation is three. Specifically, the access operations included in the second cycle operation is the fourth access operation, the fifth access operation, and the sixth access operation. As noted above, the number of access operations included in the second cycle operation is relatively small. Accordingly, relatively high transportation efficiency by the second transport mechanism is obtainable.

The third transport mechanism repeatedly performs the third cycle operation in accordance with the control by the controller. The third cycle operation is composed of only two or three access operations. In other words, the number of access operations included in the third cycle operation is two or three. The access operations included in the third cycle operation is the seventh access operation and the eighth access operation. As noted above, the number of access operations included in the third cycle operation is relatively small. Accordingly, relatively high transportation efficiency by the third transport mechanism is obtainable.

As described above, since the first, second, and third transport mechanisms each have the relatively high transportation efficiency, the substrate treating apparatus achieves suitably enhanced throughput.

It is preferred in the above-described substrate treating apparatus that the sixth access operation includes operation by the second transport mechanism of picking up the substrate on the third mount table, and placing the substrate onto the third mount table, the seventh access operation includes operation by the third transport mechanism of picking up the substrate on the third mount table, and placing the substrate onto the third mount table, and the eighth access operation includes operation by the third transport mechanism of loading the substrate into the third processing section, and unloading the substrate from the third processing section.

With such a configuration, the first, second and third transport mechanisms are capable of transporting the substrate, supplied from the indexer, to the first, second, and third processing sections. Moreover, the first, second, and third transport mechanisms are capable of transporting the substrate, subjected to the treatment by the first, second, and third processing sections, back to the indexer.

In the substrate treating apparatus described above, it is preferred that one of the first processing section and the second processing section corresponds to an edge exposing section that exposes a peripheral edge of the substrate to light, the other of the first processing section and the second processing section corresponds to a heat treating section that performs a heat treatment to the substrate, and the third processing section corresponds to a liquid treating section that performs a liquid treatment to the substrate. The first and second processing sections are arranged closer to the indexer than the third processing section. Consequently, the edge exposing section and the heat treating section are each arrangeable at a position relatively closer to the indexer. In other words, the third processing section is arranged at a position farther from the indexer than the first and second processing sections. Consequently, the liquid treating section is arrangeable at a position relatively farther from the indexer.

In the above-described substrate treating apparatus, the first transport mechanism, the second transport mechanism, and the third transport mechanism transport the substrate, supplied from the indexer, to the edge exposing section, the liquid treating section, and the heat treating section, in this order, in accordance with the control by the controller, and the first transport mechanism and the second transport mechanism transport the substrate, unloaded from the heat treating section, back to the indexer without delivering the substrate to the third transport mechanism in accordance with the control by the controller. Such is preferable. The third transport mechanism does not transport the substrate unloaded from the heat treating section. That is, the third transport mechanism does not contact to the substrate subjected to the heat treatment. The third transport mechanism transports only the substrate, prior to heat treatment, to the liquid treating section. Accordingly, no thermal influence from the substrate subjected to the heat treatment is exerted on the third transport mechanism. Accordingly, no thermal influence from the third transport mechanism is exerted on the substrate to be transported to the liquid treating section. As a result, this suitably prevents loss of quality of the liquid treatment in the liquid treating section.

It is preferred in the substrate treating apparatus mentioned above that a heat insulation space is provided for separating the third processing section from the second processing section. This achieves effective reduction in thermal influence on the third processing section from the second processing section.

The above-described substrate treating apparatus further includes a maintenance space. The third processing section includes a third long processing section and a third short processing section, the third transport mechanism is disposed between the third long processing section and the third short processing section. The third long processing section, the third transport mechanism, and the third short processing section are arranged in a width direction. The third short processing section has a length in a forward/rearward direction perpendicular to the width direction that is shorter than a length of the third long processing section in the forward/backward direction. The maintenance space and the third short processing section are arranged in the forward/backward direction. Such is preferable. Since the substrate treating apparatus includes the maintenance space, suitable maintenance is performable to the substrate treating apparatus.

It is preferred that the substrate treating apparatus described above further includes a first block accommodating the first processing section, the first transport mechanism, the second processing section, the second transport mechanism, and the second mount table, and a second block connected to the first block and accommodating the third processing section and the third transport mechanism, the first block being substantially rectangular in front view, in plan view and in side view, and the second block being substantially rectangular in front view, in plan view and in side view. The first processing section and the second processing section are disposed in the first block. The third processing section is disposed in the second block. With such a configuration, the first and the second processing sections are separable from the third processing section suitably.

The substrate treating apparatus described above further includes a first frame provided as a framework of the first block, and a second frame provided as a framework of the second block. The first frame supports the first transport mechanism, the second transport mechanism, the first processing section, the second processing section, and the second mount table. The second frame supports the third transport mechanism and the third processing section. The second frame is coupled to the first frame. Such is preferable. The first frame and the second frame are capable of forming the first block and the second block suitably.

Another aspect of the present invention provides a substrate treating apparatus. The substrate treating apparatus includes a first processing section that performs treatment to a substrate, a second processing section that performs treatment to a substrate, a transportation space formed laterally of the first processing section and the second processing section, a first transport mechanism that is disposed in the transportation space and transports the substrate to the first processing section, a second transport mechanism that is disposed in the transportation space and transports the substrate to the second processing section, and a mount table on which the substrate transported between the first transport mechanism and the second transport mechanism is placed, the mount table including a first portion overlapped on the first processing section in plan view and a second portion overlapped on the second processing section in plan view.

The substrate is transported between the first transport mechanism and the second transport mechanism via the mount table. The first transport mechanism transports the substrate to the first processing section. The second transport mechanism transports the substrate to the second processing section. The first processing section and the second processing section each perform the treatment to the substrate.

The mount table is positioned so as to overlap both the first processing section and the second processing section. Accordingly, a distance between the first transport mechanism and the second transport mechanism can be reduced. As a result, reduction in footprint of the substrate treating apparatus is obtainable.

It is preferred in the substrate treating apparatus mentioned above that the mount table includes a third portion overlapped on the transportation space in plan view. The first transport mechanism and the second transport mechanism allow easy access to the mount table individually.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIG. 12 is a left side view of a left portion of the substrate treating apparatus.

FIG. 13 is a left side view of a middle portion of the substrate treating apparatus in a width direction.

DESCRIPTION OF EMBODIMENTS

The following describes a substrate treating apparatus of the present invention with reference to drawings.

First Embodiment

<Summary of Substrate Treating Apparatus>

Figure 1:
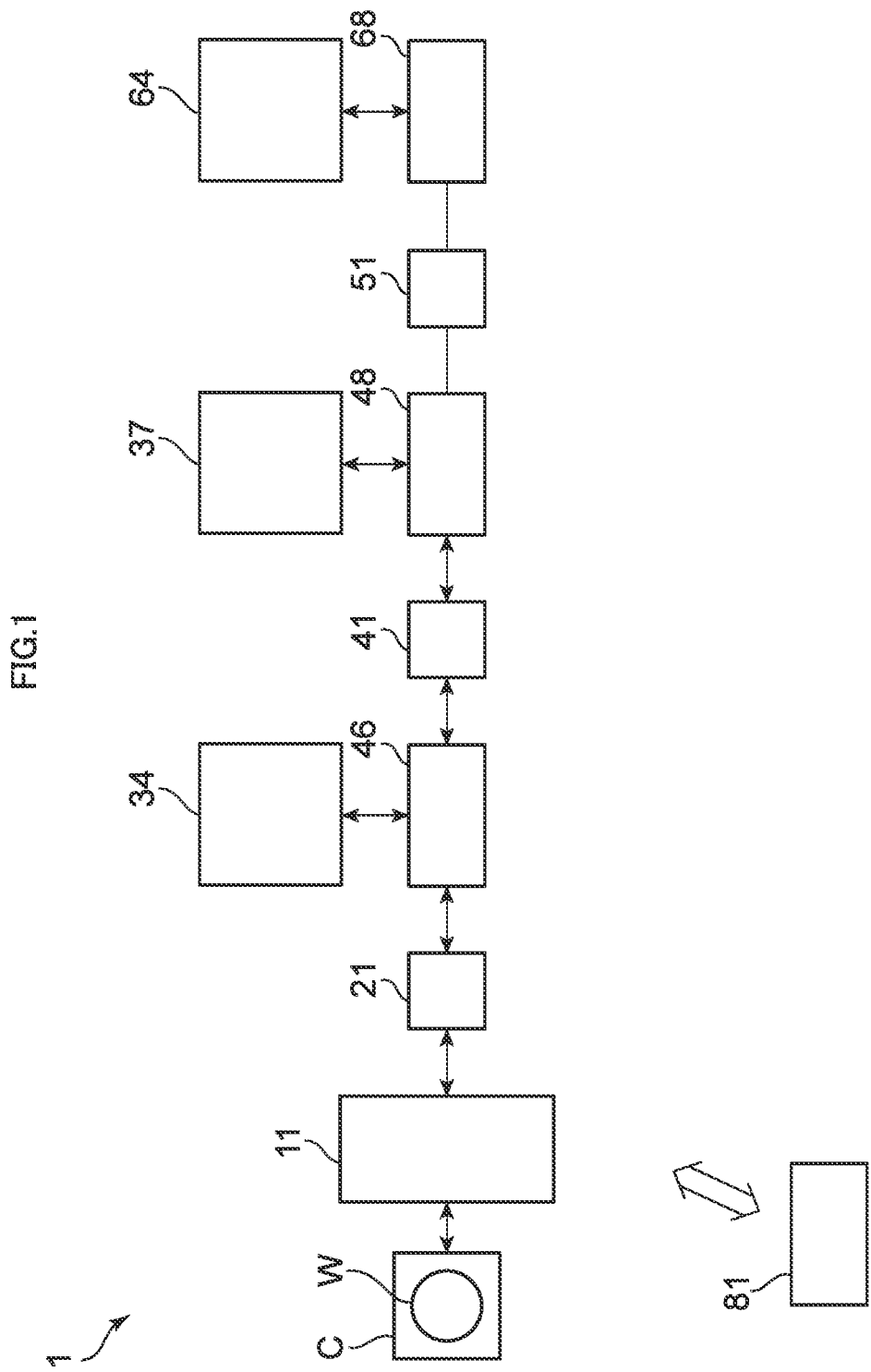
FIG. 1 is a conceptual view of a substrate treating apparatus according to a first embodiment.

FIG. 1 is a conceptual view of a substrate treating apparatus according to the first embodiment 1. A substrate treating apparatus 1 according to the first embodiment performs a succession of treatment to substrates (e.g., semiconductor wafers) W.

Examples of the substrates W include a semiconductor wafer, a substrate for liquid crystal display, a substrate for organic electroluminescence (EL), a substrate for flat plasma display (FPD), a substrate for optical display, a magnetic disk substrate, an optical disk substrate, a substrate for photomask, and a solar cell substrate. The substrate W is substantially circular in plan view.

The substrate treating apparatus 1 further includes an indexer 11. The indexer 11 unloads the substrate W from a carrier C. Moreover, the indexer 11 loads the substrate W into the carrier C. The carrier C accommodates a plurality of substrates W. The carrier C is, for example, a front opening unified pod (FOUP).

The substrate treating apparatus 1 further includes a first processing section 34, a second processing section 37, and a third processing section 64. The first processing section 34, the second processing section 37, and the third processing section 64 each perform treatment to the substrate W. The treatment to the substrate W by the first processing section 34 is different from that by the second processing section 37. The treatment to the substrate W by the first processing section 34 is different from that by the third processing section 64. The treatment to the substrate W by the second processing section 37 is different from that by the third processing section 64.

The first processing section 34 is, for example, an edge exposing section that exposes a peripheral edge of the substrate W to light. The treatment to the substrate W by the first processing section 34 is, for example, an edge exposure treatment for exposing the peripheral edge of the substrate W.

The second processing section 37 is, for example, a heat treating section that performs a heat treatment to the substrate W. The treatment to the substrate W by the second processing section 37 is, for example, a heat treatment. The heat treatment by the second processing section 37 includes a heating treatment for heating the substrate W.

The third processing section 64 is, for example, a liquid treating section that performs a liquid treatment to the substrate W. The treatment to the substrate W by the third processing section 64 is, for example, a liquid treatment. Here, the liquid treatment by the third processing section 64 is, for example, a developing process for supplying a developer to the substrate W to develop the substrate W.

The substrate treating apparatus 1 includes a first transport mechanism 46, a second transport mechanism 48, and a third transport mechanism 68. The first transport mechanism 46, the second transport mechanism 48, and the third transport mechanism 68 each transport the substrate W. The first transport mechanism 46 transports the substrate W to the first processing section 34. The first transport mechanism 46 does not transport the substrate W to the second processing section 37 and the third processing section 64. The second transport mechanism 48 transports the substrate to the second processing section 37. The second transport mechanism 48 does not transport the substrate W to the first processing section 34 and the third processing section 64. The third transport mechanism 68 transports the substrate W to the third processing section 64. The third transport mechanism 68 does not transport the substrate W to the first processing section 34 and the second processing section 37.

The substrate treating apparatus 1 further includes a first mount table 21, a second mount table 41, and a third mount table 51. The first mount table 21, the second mount table 41, and the third mount table 51 each places the substrate W thereon. The substrate W transported between the indexer 11 and the first transport mechanism 46 is placed on the first mount table 21. The substrate W transported between the first transport mechanism 46 and the second transport mechanism 48 is placed on the second mount table 41. The substrate W transported between the second transport mechanism 48 and the third transport mechanism 68 is placed on the third mount table 51.

The substrate treating apparatus 1 further includes a controller 81. The controller 81 is disposed in the indexer 11, for example. The controller 81 controls the substrate treating apparatus 1. Specifically, the controller 81 controls the indexer 11, the first processing section 34, the second processing section 37, the third processing section 64, the first transport mechanism 46, the second transport mechanism 48, and the third transport mechanism 68.

The controller 81 is implemented by a central processing unit (CPU) that performs various processes, a RAM (Random-Access Memory) as a workspace of arithmetic processing, and a storage medium such as a fixed disk. The storage medium stores various information such as processing recipes for processing the substrate W (processing programs) and information about identification of the substrates W.

Figure 2:
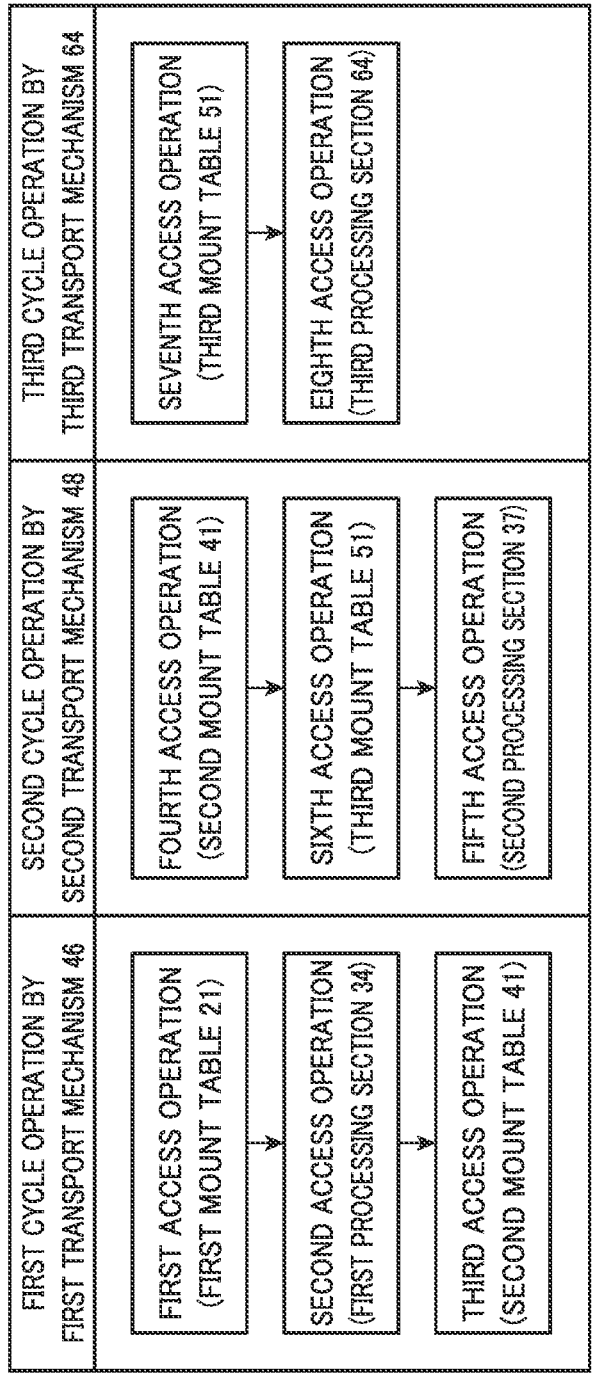
FIG. 2 schematically illustrates first to third cycle operations.

FIG. 2 schematically illustrates first to third cycle operations. The first transport mechanism 46 repeatedly performs the first cycle operation in accordance with the control by the controller 81. The second transport mechanism 48 repeatedly performs the second cycle operation in accordance with the control by the controller 81. The third transport mechanism 68 repeatedly performs the third cycle operation in accordance with the control by the controller 81.

The first cycle operation by the first transport mechanism 46 is composed of three access operations. The three access operations included in the first cycle operation is as under:
  First access operation of accessing the first mount table 21
  Second access operation of accessing the first processing section 34
  Third access operation of accessing the second mount table 41

Here, the first access operation includes operation of picking up the substrate W on the first mount table 21 by the first transport mechanism 46 and operation of placing the substrate W onto the first mount table 21 by the first transport mechanism 46. The second access operation includes operation of loading the substrate W into the first processing section 34 by the first transport mechanism 46 and operation of unloading the substrate W from the first processing section 34 by the first transport mechanism 46. The third access operation includes operation of picking up the substrate W on the second mount table 41 by the second transport mechanism 46 and operation of placing the substrate W onto the second mount table 41 by the first transport mechanism 46.

The second cycle operation by the second transport mechanism 48 is composed of three access operations. The three access operations included in the second cycle operation is as under:
  Fourth access operation of accessing the second mount table 41
  Fifth access operation of accessing the second processing section 37
  Sixth access operation of accessing the third mount table 51

Here, the fourth access operation includes operation of picking up the substrate W on the second mount table 41 by the second transport mechanism 48 and operation of placing the substrate W onto the second mount table 41 by the second transport mechanism 48. The fifth access operation includes operation of loading the substrate W into the second processing section 37 by the second transport mechanism 48 and operation of unloading the substrate W from the second processing section 37 by the second transport mechanism 48. The sixth access operation includes operation of picking up the substrate W on the third mount table 51 by the second transport mechanism 48 and operation of placing the substrate W onto the third mount table 51 by the second transport mechanism 48.

The third cycle operation by the third transport mechanism 68 is composed of two access operations. The two access operations included in the third cycle operation is as under:
  Seventh access operation of accessing the third mount table 51
  Eighth access operation of accessing the third processing section 64

Here, the seventh access operation includes operation of picking up the substrate W on the third mount table 51 by the third transport mechanism 68 and operation of placing the substrate W onto the third mount table 51 by the third transport mechanism 68. The eighth access operation includes operation of loading the substrate W into the third processing section 64 by the third transport mechanism 68 and operation of unloading the substrate W from the third processing section 64 by the third transport mechanism 68.

The substrate treating apparatus 1 operates as under. The first transport mechanism 46, the second transport mechanism 48, and the third transport mechanism 68 transport the substrate W, supplied from the indexer 11, to the first processing section (edge exposing section) 34, the third processing section (liquid treating section) 64, and the second processing section (heat treating section) 37 in this order in accordance with the control by the controller 81. Thereafter, the first transport mechanism 46 and the second transport mechanism 48 transport the substrate W from the second processing section 37 to the indexer 11. Here, the first transport mechanism 46 and the second transport mechanism 48 transport the substrate, unloaded from the second processing section (heat treating section) 37, back to the indexer 11 without delivering the substrate W to the third transport mechanism 68. The following describes in more detail one example of the operation of the substrate treating apparatus 1.

Figure 3:
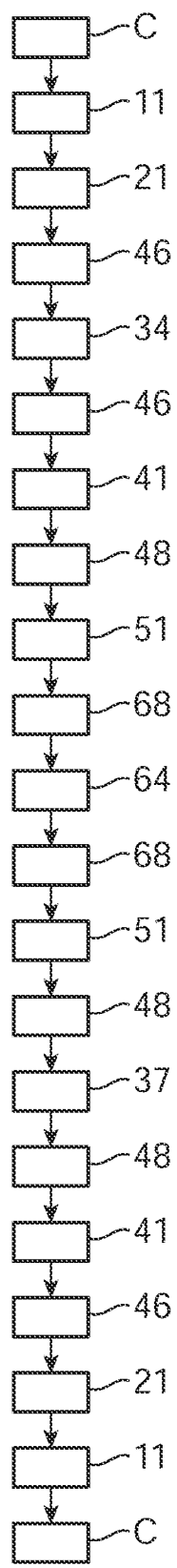
FIG. 3 schematically illustrates a transportation path of a substrate.

Reference is made to FIGS. 2 and 3. FIG. 3 schematically illustrates a transportation path of the substrate.

The indexer 11 unloads the substrate W from a carrier C. The indexer 11 places the substrate W on the first mount table 21. Accordingly, the indexer 11 delivers the substrate W from the carrier C to the first mount tables 21.

The first transport mechanism 46 picks up a substrate W on the first mount table 21 (first access operation). The transport mechanism 46 loads the substrate W into the first processing section 34 (second access operation). Consequently, the first transport mechanism 46 transports the substrate W from the first mount table 21 to the first processing section 34. The first processing section 34 performs treatment (edge exposure treatment) to the substrate W. The transport mechanism 46 unloads the substrate W from the first processing section 34 (second access operation). The first transport mechanism 46 places the substrate W onto the second mount table 41 (third access operation). Consequently, the first transport mechanism 46 transports the substrate W from the first processing section 34 to the second mount table 41.

The second transport mechanism 48 picks up the substrate W on the second mount table 41 (fourth access operation). The second transport mechanism 48 places the substrate W onto the third mount table 51 (sixth access operation). Consequently, the second transport mechanism 48 transports the substrate W from the second mount table 41 to the third mount table 51.

The third transport mechanism 68 picks up the substrate W on the third mount table 51 (seventh access operation). The third transport mechanism 68 loads the substrate W into the third processing section 64 (eighth access operation). Consequently, the third transport mechanism 68 transports the substrate W from the third mount table 51 to the third processing section 64. The third processing section 64 performs treatment (liquid treatment) to the substrate W. The third transport mechanism 68 unloads the substrate W from the third processing section 64 (eighth access operation). The third transport mechanism 68 places the substrate W onto the third mount table 51 (seventh access operation). Consequently, the third transport mechanism 68 transports the substrate W from the third processing section 64 to the third mount table 51.

The second transport mechanism 48 picks up the substrate W on the third mount table 51 (sixth access operation). The second transport mechanism 48 loads the substrate W into the second processing section 37 (fifth access operation). Consequently, the second transport mechanism 48 transports the substrate W from the third mount table 51 to the second processing section 37. The second processing section 37 performs treatment (heat treatment) to the substrate W. The second transport mechanism 48 unloads the substrate W from the second processing section 37 (fifth access operation). The second transport mechanism 48 places the substrate W onto the second mount table 41 (fourth access operation). Consequently, the second transport mechanism 48 transports the substrate W from the second processing section 37 to the second mount table 41.

The first transport mechanism 46 picks up the substrate W on the second mount table 41 (third access operation). The first transport mechanism 46 places the substrate W onto the first mount table 21 (first access operation). Consequently, the first transport mechanism 46 transports the substrate W from the second mount table 41 to the first mount table 21.

The indexer 11 picks up the substrate W on the first mount table 21. The indexer 11 loads the substrate W into the carrier C. Accordingly, the indexer 11 delivers the substrate W from the first mount tables 21 to the carrier C.

Here, the substrate treating apparatus 1 allows treatment to a plurality of substrates W simultaneously. When the substrate treating apparatus 1 performs the treatment to a plurality of substrates W, the first transport mechanism 46 performs picking up of the substrate W on the first mount table 21 and placing of the substrate W onto the first mount table 21 in one-time first access operation. The same is applicable to the second to eighth access operations.

<Primary Effect of First Embodiment>

The substrate treating apparatus 1 described above produces the following effects.

The substrate treating apparatus 1 includes three processing sections (34, 37, 64). The substrate treating apparatus 1 includes transport mechanisms (46, 48, 68) for the three processing sections (34, 37, 64), respectively. The first transport mechanism 46 is provided for the first processing section 34, the second transport mechanism 48 is provided for the second processing section 37, and the third transport mechanism 68 is provided for the third processing section 64. Consequently, the number of processing sections to which the first transport mechanism 46 transports the substrate W is one. This achieves suitable prevention of the number of access operations included in the first cycle operation by the first transport mechanism 46 from increasing to four or more. Likewise, the number of processing sections to which the second transport mechanism 48 transports the substrate W is one. This achieves suitable prevention of the number of access operations included in the second cycle operation by the second transport mechanism 48 from increasing to four or more. The number of processing sections to which the third transport mechanism 68 transports the substrate W is one. This achieves suitable prevention of increase in number of access operations included in the third cycle operation by the third transport mechanism 68 from increasing to four or more.

Specifically, the number of access operations included in the first cycle operation is three. The number of access operations included in the first cycle operation is relatively small. Accordingly, the frequency of cycle operation performable per unit time by the first transport mechanism 46 is relatively large. In other words, the number of substrates W transportable per unit time by the first transport mechanism 46 is relatively large. That is, efficiency at which the first transport mechanism 46 transports the substrates W (hereinafter, referred to as "transportation efficiency" appropriately) is relatively high.

The number of access operations included in the second cycle operation is three. The number of access operations included in the second cycle operation is relatively small. Accordingly, relatively high transportation efficiency by the second transport mechanism 48 is obtainable.

The number of access operations included in the third cycle operation is two. The number of access operations included in the third cycle operation is relatively small. Accordingly, relatively high transportation efficiency by the third transport mechanism 68 is obtainable.

As described above, since the first transport mechanism 46, the second transport mechanism 48, and the third transport mechanisms 68 each have the relatively high transportation efficiency, the number of substrates W per unit time capable of treated by the substrate treating apparatus 1 is relatively large. This achieves suitably enhanced throughput of the substrate treating apparatus 1.

The first access operation includes the operation of picking up the substrate W on the first mount table 21 and the operation of placing the substrate W onto the first mount table 21. The second access operation includes the operation of loading the substrate W into the first processing section 34 and the operation of unloading the substrate W from the first processing section 34. The third access operation includes the operation of picking up the substrate W on the second mount table 41 and the operation of placing the substrate W onto the second mount table 41. The fourth access operation includes the operation of picking up the substrate W on the second mount table 41 and the operation of placing the substrate W onto the second mount table 41. The fifth access operation includes the operation of loading the substrate W into the second processing section 37 and the operation of unloading the substrate W from the second processing section 37. The sixth access operation includes the operation of picking up the substrate W on the third mount table 51 and the operation of placing the substrate W onto the third mount table 51. The seventh access operation includes the operation of picking up the substrate W on the third mount table 51 and the operation of placing the substrate W onto the third mount table 51. The eighth access operation includes the operation of loading the substrate W into the third processing section 64 and the operation of unloading the substrate W from the third processing section 64. From the above, the first transport mechanism 46, the second transport mechanism 48, and the third transport mechanism 68 are capable of transporting the substrate W, supplied from the indexer 11, to the first processing section 34, the second processing section 37, and the third processing section 64. Moreover, the first transport mechanism 46, the second transport mechanism 48, and the third transport mechanism 68 are capable of transporting the substrate W, subjected to the treatment by the first processing section 34, the second processing section 37, and the third processing section 64, back to the indexer 11.

The first transport mechanism 46, the second transport mechanism 48, and the third transport mechanism 68 transport the substrate W, supplied from the indexer 11, to the first processing section (edge exposing section) 34, the third processing section (liquid treating section) 64, and the second processing section (heat treating section) 37 in this order. Moreover, the first transport mechanism 46 and the second transport mechanism 48 transports the substrate, unloaded from the second processing section (heat treating section) 37, to the indexer 11 without delivering the substrate W to the third transport mechanism 68. Consequently, the third transport mechanism 68 does not transport the substrate W unloaded from the second processing section (heat treating section) 37. That is, the third transport mechanism 68 does not contact to the substrate W subjected to the heat treatment. The third transport mechanism 68 transports only the substrate prior to heat treatment. Accordingly, no thermal influence from the substrate W subjected to the heat treatment is exerted on the third transport mechanism 68. Accordingly, the third transport mechanism 68 is capable of transporting the substrate W into the third processing section (liquid treating section) 64 without exerting any thermal influence on the substrate W. For instance, the third transport mechanism 68 is capable of transporting the substrate W into the third processing section (liquid treating section) 64 without any variation in temperature of the substrate W. This allows suitable prevention of loss of treatment quality in the third processing section (liquid treating section) 64.

The following describes the substrate treating apparatus 1 in more detail.

<Overall Configuration of Substrate Treating Apparatus 1>

Figure 4:
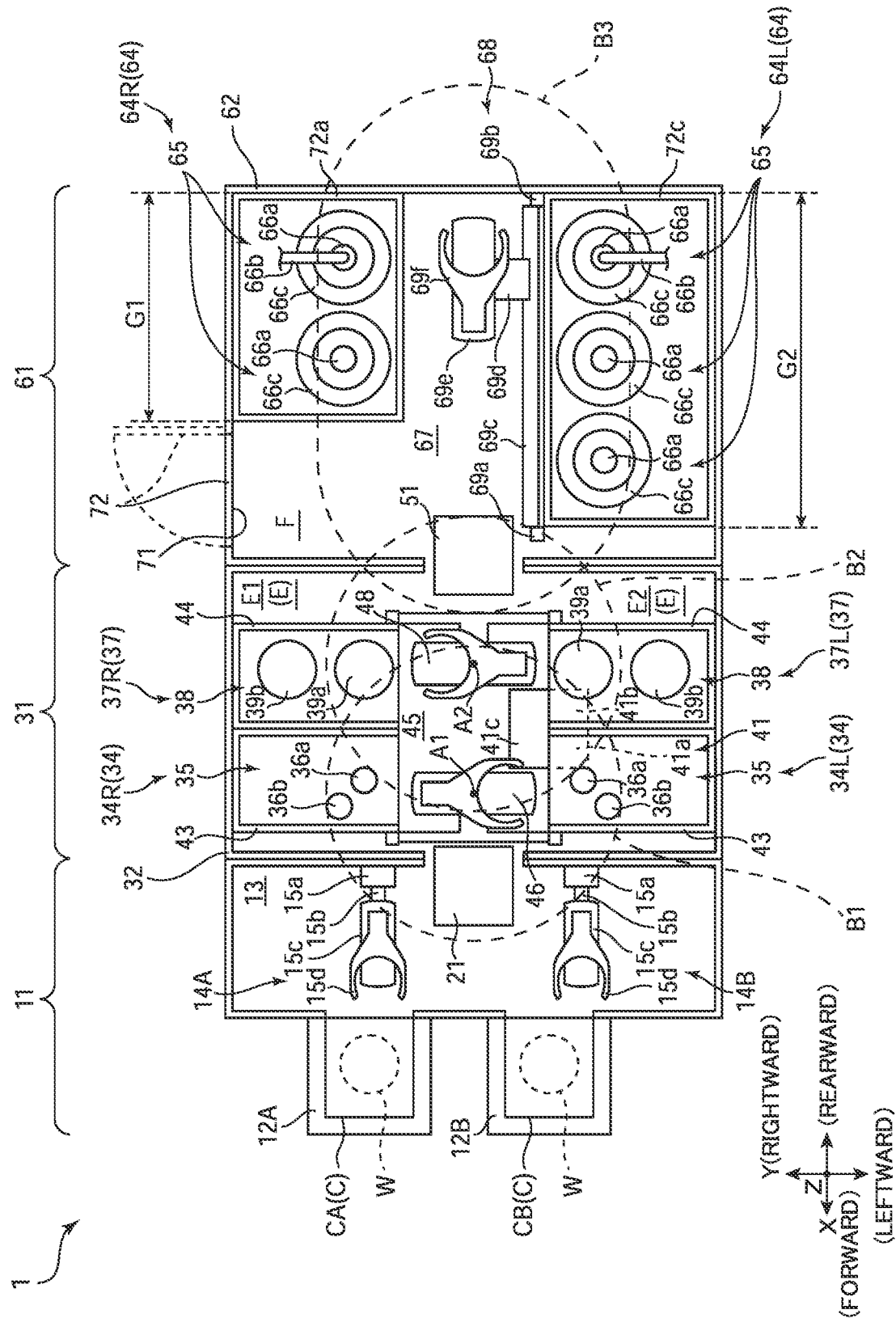
FIG. 4 is a plan view of the substrate treating apparatus according to the first embodiment.

FIG. 4 is a plan view of the substrate treating apparatus 1 according to the first embodiment. The substrate treating apparatus 1 includes the indexer 11, a first block 31, and a second block 61. The first block 31 is connected to the indexer 11. The second block 61 is connected to the first block 31. The first block 31 accommodates the first processing section 34, the second processing section 37, the second mount table 41, the first transport mechanism 46, and the second transport mechanism 48. The second block 61 accommodates the third processing section 64 and the third transport mechanism 68. The first mount table 21 is arranged across the indexer 11 and the first block 31. The third mount table 51 is arranged across the first block 31 and the second block 61.

The indexer block 11, the first block 31, and the second block 61 are arranged in line horizontally. The first block 31 is disposed between the indexer 11 and the second block 61.

Here, a direction where the indexer 11, the first block 31, and the second block 61 are arranged is referred to as a "forward/rearward direction". One direction of the forward/rearward direction X from the second block 61 to the indexer 11 is referred to as a "forward direction". The direction opposite to the forward direction is referred to as a "rearward direction". A horizontal direction orthogonal to the forward/rearward direction X is referred to as a "width direction Y" or a "lateral direction". Moreover, one direction of the width direction Y is referred to as a "rightward direction" appropriately. The direction opposite to the rightward direction is referred to as a "leftward direction". A vertical direction is referred to as an "upward/downward direction Z". The upward/downward direction Z is orthogonal to the forward/rearward direction X and the width direction Y. In each of the drawings, the terms forward, rearward, rightward, leftward, upward, and downward are indicated appropriately.

The following describes each element of the substrate treating apparatus 1.

<Indexer 11>

Figure 5:
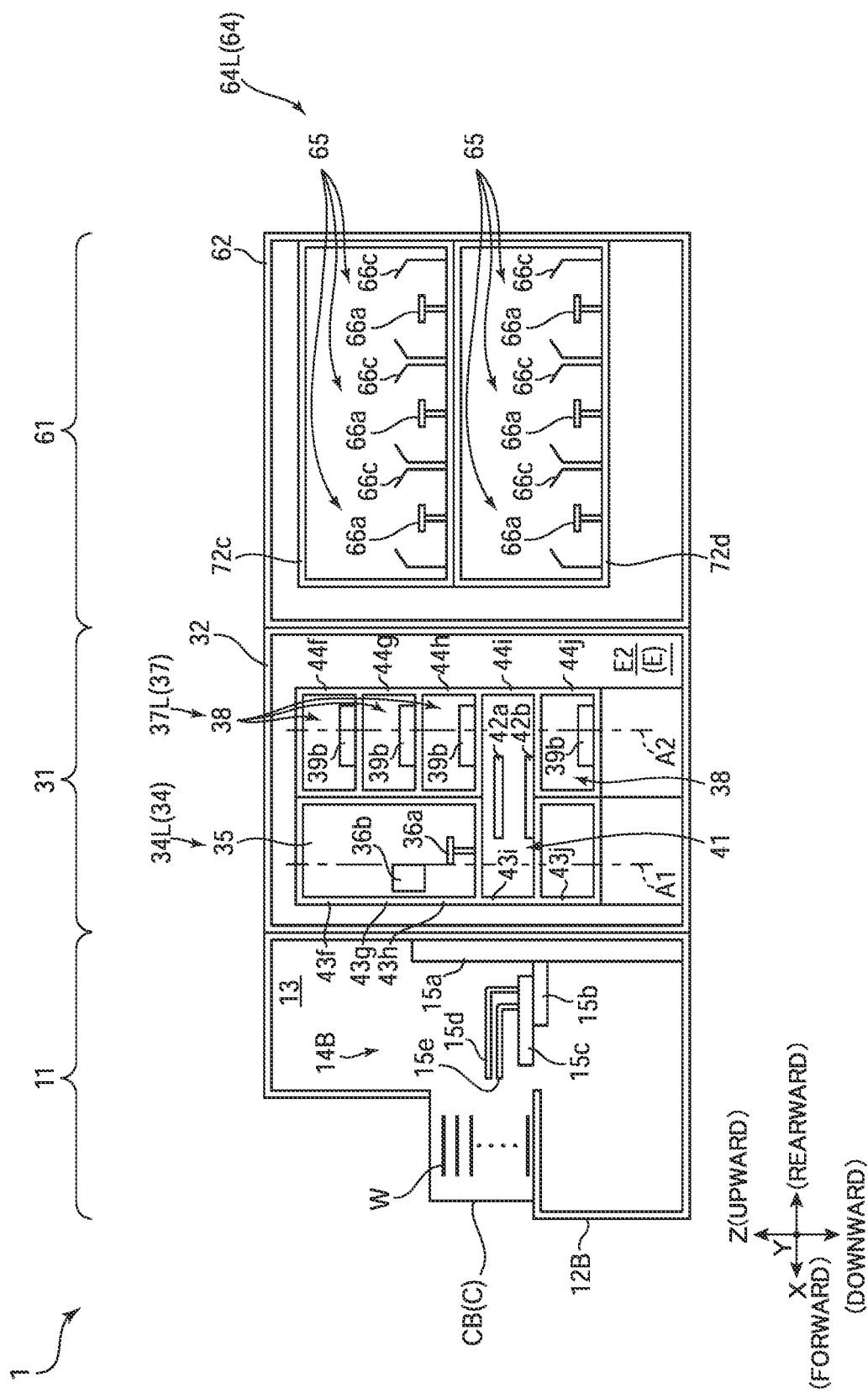
FIG. 5 is a left side view of a left portion of the substrate treating apparatus.
Figure 6:
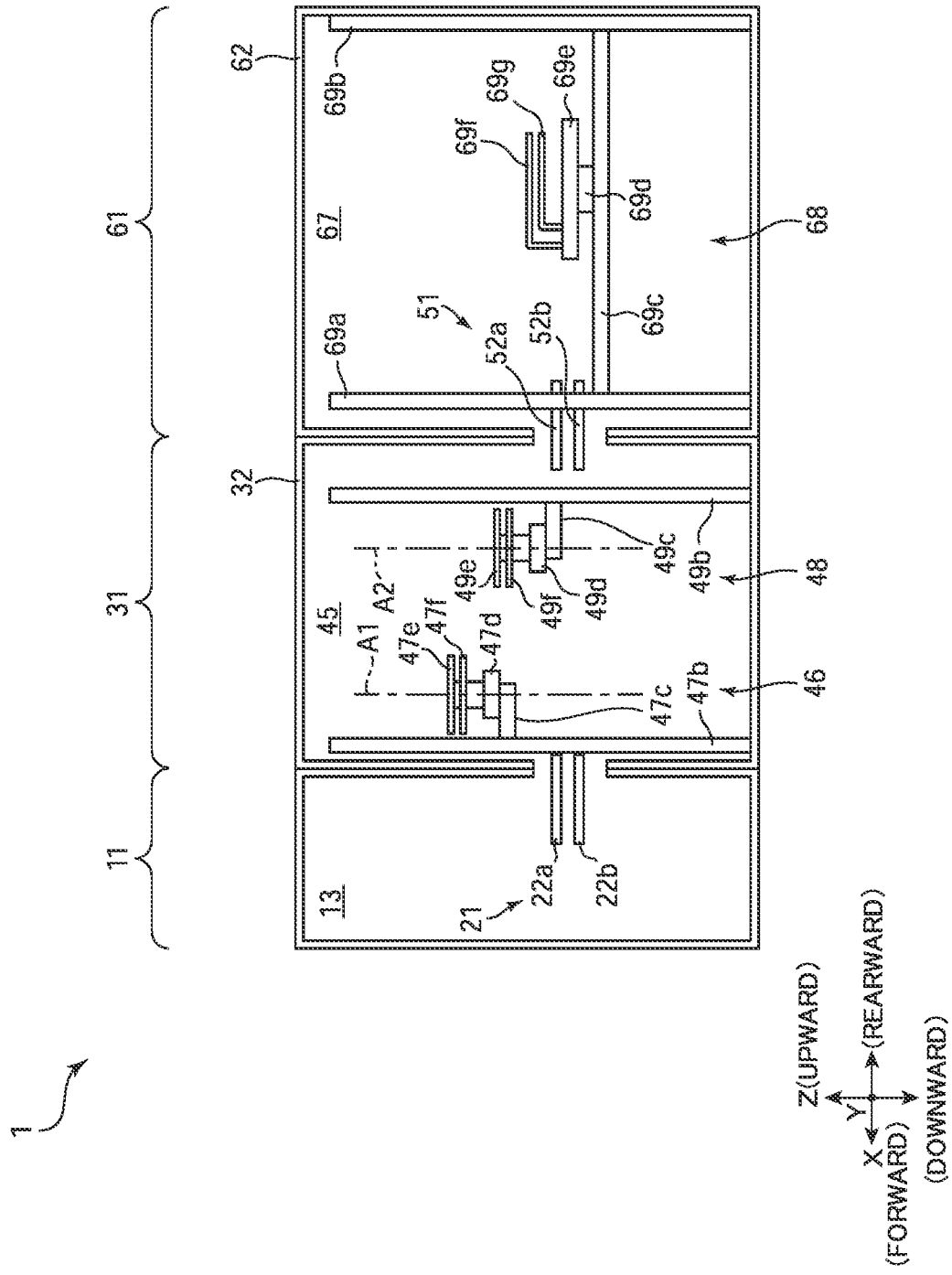
FIG. 6 is a left side view of a middle portion of the substrate treating apparatus in a width direction.
Figure 7:
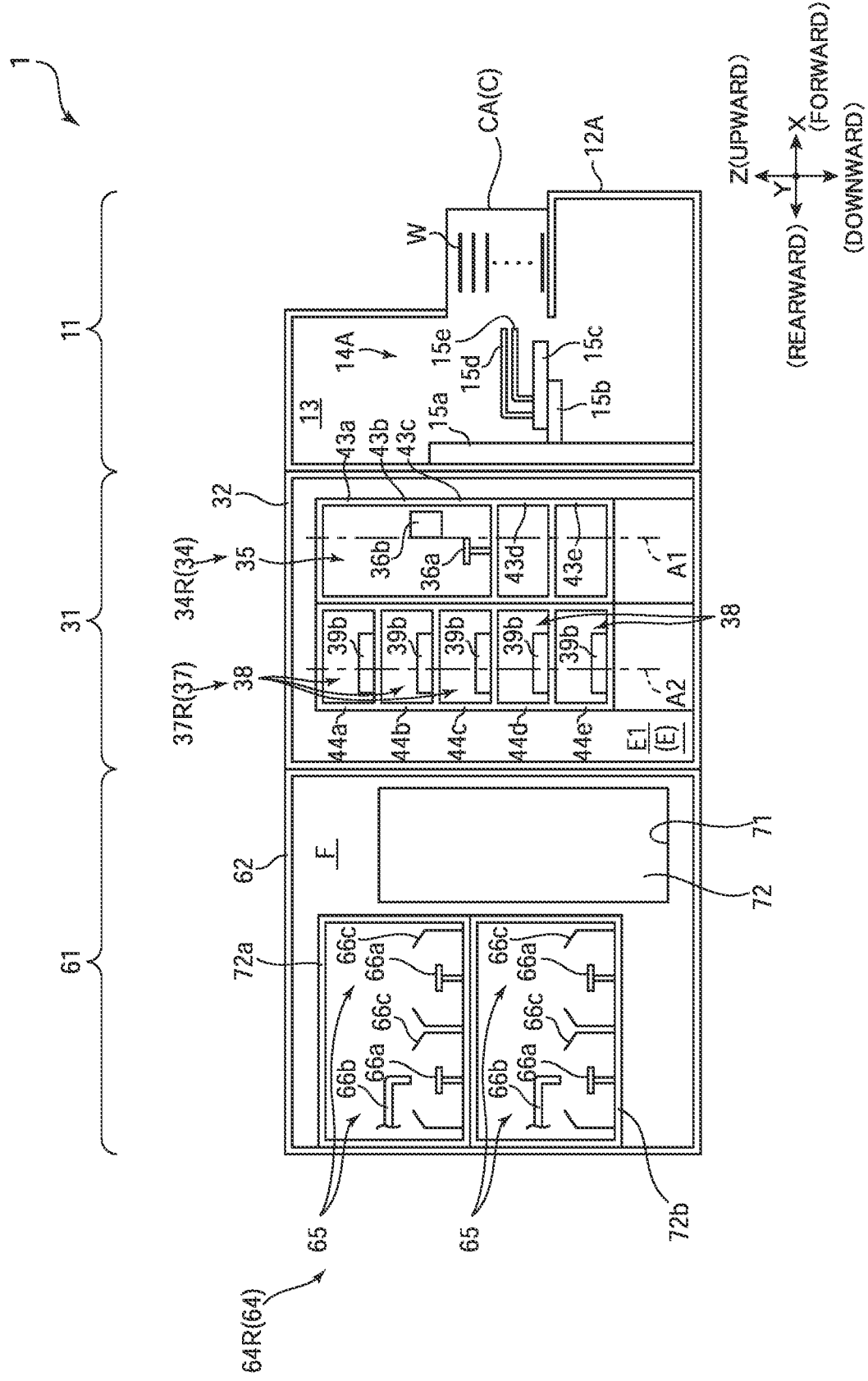
FIG. 7 is a right side view of a right portion of the substrate treating apparatus.

Reference is made to FIGS. 4 to 7. FIG. 5 is a left side view of a left portion of the substrate treating apparatus 1. FIG. 6 is a left side view of a middle portion of the substrate treating apparatus 1 in the width direction Y. FIG. 7 is a right side view of a right portion of the substrate treating apparatus 1.

The indexer block 11 includes carrier mount tables 12A, 12B. The carrier mount tables 12A, 12B are arranged in a width direction Y. The carrier mount table 12A is disposed rightward of the carrier mount table 12B. The carrier mount tables 12A, 12B each have one carrier C placed thereon.

If distinction is made between the carrier C on the carrier mount table 12A and the carrier C on the carrier mount table 12B, the former is referred to as a "carrier CA" and the latter is referred to as a "carrier CB".

The indexer 11 includes a transportation space 13. The transportation space 13 is disposed rearward of the carrier mount tables 12A, 12B.

The indexer 11 includes indexer transport mechanisms 14A, 14B. The indexer transport mechanisms 14A, 14B are disposed in the transportation space 13. The indexer transport mechanisms 14A, 14B are arranged in the width direction Y. The indexer transport mechanism 14B is disposed leftward of the indexer transport mechanism 14A. The indexer transport mechanism 14A is disposed rearward of the carrier mount table 12A. The indexer transport mechanism 14B is disposed rearward of the carrier mount table 12B.

The indexer transport mechanism 14A includes a strut 15a, a lifting member 15b, a rotator 15c, and holders 15d, 15e. The holder 15e is illustrated in FIG. 7. The strut 15a extends in the upward/downward direction Z. The strut 15a is disposed in a fixed manner. In other words, the strut 15a is immovable. The lifting member 15b is supported on the strut 15a. The lifting member 15b is movable in the upward/downward direction Z with respect to the strut 15a. The lifting member 15b is immovable in the horizontal direction. The rotator 15c is supported on the lifting member 15b. The rotator 15c is rotatable with respect to the lifting member 15b. A rotation axis of the rotator 15c is parallel to the upward/downward direction Z. The rotator 15c is immovable in the horizontal direction. The holders 15d, 15e are supported on the rotator 15c. The holders 15d, 15e are capable of reciprocating with respect to the rotator 15c in the horizontal direction. The holders 15d, 15e are capable of reciprocating independently. The holders 15d, 15e each contact to the substrate W. The holders 15d, 15e each hold one substrate W horizontally.

The indexer transport mechanism 14B has substantially the same configuration as that of the indexer transport mechanism 14A. That is, the indexer transport mechanism 14B includes a strut 15a, a lifting member 15b, a rotator 15c, and holders 15d, 15e.

As described above, if the different elements have the same configuration, a common numeral is applied to the configuration to omit the detailed description of the elements in the present embodiment.

The indexer transport mechanism 14A is accessible to the carrier C and the first mount table 21. The indexer transport mechanism 14A is capable of unloading the substrate W from the carrier Ca and loading the substrate W into the carrier CA. The indexer transport mechanism 14A is capable of placing the substrate W onto the first mount table 21 and picking up the substrate W on the first mount table 21. The indexer transport mechanism 14A is inaccessible to the carrier CB.

The indexer transport mechanism 14B is accessible to the carrier CB and the first mount table 21. The indexer transport mechanism 14B is capable of unloading the substrate W from the carrier CB and loading the substrate W into the carrier CB. The indexer transport mechanism 14B is capable of placing the substrate W onto the first mount table 21 and picking up the substrate W on the first mount table 21. The indexer transport mechanism 14B is inaccessible to the carrier CA.

The indexer transport mechanisms 14A, 14B are controlled by the controller 81. The indexer transport mechanism 14A performs access operation to the carrier CA and access operation to the first mount table 21 alternately in accordance with the control by the controller 81. The indexer transport mechanism 14B performs access operation to the carrier CB and access operation to the first mount table 21 alternately in accordance with the control by the controller 81. Accordingly, the indexer 11 unloads the substrate W from the carrier C and delivers the substrate from the carrier C to the first transport mechanism 46. Moreover, the indexer 11 receives the substrate W from the first transport mechanism 46, and loads the substrate W from the first transport mechanism 46 into the carrier C.

<First Block 31>

Figure 8:
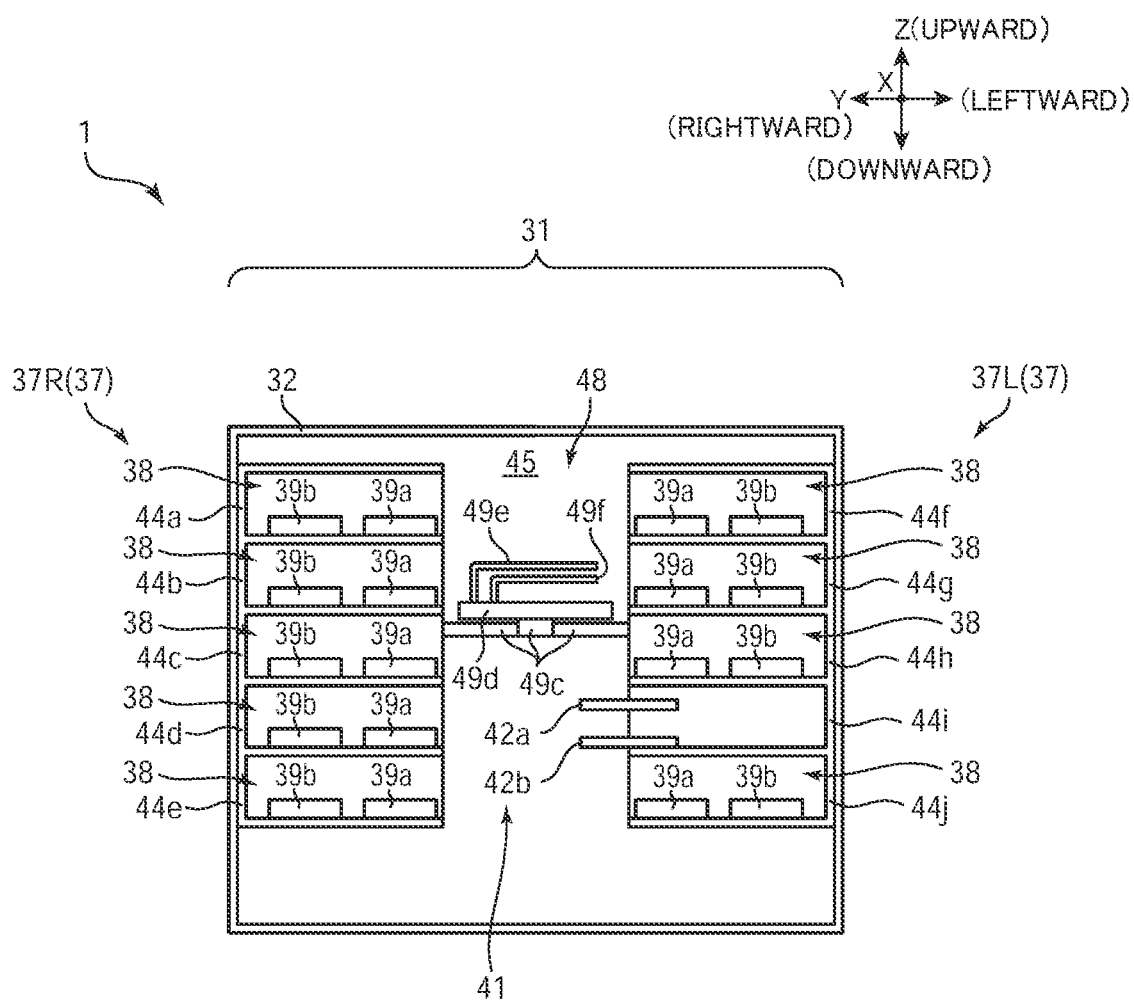
FIG. 8 is a front view of a first block.

Reference is made to FIGS. 4 to 8. FIG. 8 is a front view of the first block 31 (specifically, the second processing section 37 and the second transport mechanism 48). The first block 31 has substantially a box shape. The first block 31 is substantially rectangular in plan view, in front view, and in side view.

The first block 31 has a first frame 32. The first frame 32 is provided as a shell (contour) of the first block 31. The first frame 32 defines the shape of the first block 31. The first frame 32 is, for example, made of metal.

The first frame 32 supports the first processing section 34, the second processing section 37, the second mount table 41, the first transport mechanism 46, and the second transport mechanism 48.

The substrate treating apparatus 1 further includes a transportation space 45. The transportation space 45 is formed in the first block 31. The transportation space 45 is formed laterally of the first processing section 34 and the second processing section 37. More specifically, the transportation space 45 is disposed in the middle of the first block 31 in the width direction Y. The transportation space 45 extends in the forward/rearward direction X. The transportation space 45 extends from a front part of the first block 31 to a rear part of the first block 31. The transportation space 45 contacts to the transportation space 13 of the indexer 11. The transportation space 45 and the first processing section 34 are arranged in the width direction Y. The transportation space 45 and the second processing section 37 are arranged in the width direction Y.

The first transport mechanism 46 and the second transport mechanism 48 are disposed in the transportation space 45. The first transport mechanism 46 is disposed rearward of the indexer 11. The second transport mechanism 48 is disposed rearward of the first transport mechanism 46. The first transport mechanism 46 and the second transport mechanism 48 are disposed in the forward/rearward direction X. The first transport mechanism 46 is disposed between the indexer 11 and the second transport mechanism 48.

The first processing section 34 is disposed laterally of the first transport mechanism 46. More specifically, the first processing section 34 and the first transport mechanism 46 are arranged in the width direction Y. The first processing section 34 is disposed rightward and leftward of the first transport mechanism 46. The first processing section 34 disposed rightward of the first transport mechanism 46 is referred to as a "first right processing section 34R". The first processing section 34 disposed leftward of the first transport mechanism 46 is referred to as a "first left processing section 34L". The first right processing section 34R, the first transport mechanism 46, and the first left processing section 34L are arranged in line in the width direction Y. The first transport mechanism 46 is arranged between the first right processing section 34R and the first left processing section 34L.

The second processing section 37 is disposed laterally of the second transport mechanism 48. More specifically, the second processing section 37 and the second transport mechanism 48 are arranged in the width direction Y. The second processing section 37 is disposed rightward and leftward of the second transport mechanism 48. The second processing section 37 disposed rightward of the second transport mechanism 48 is referred to as a "second right processing section 37R". The second processing section 37 disposed leftward of the second transport mechanism 48 is referred to as a "second left processing section 37L". The second right processing section 37R, the second transport mechanism 48, and the second left processing section 37L are arranged in line in the width direction Y. The second transport mechanism 48 is arranged between the second right processing section 37R and the second left processing section 37L.

The first processing section 34 and the second processing section 37 are arranged in the forward/rearward direction X. The second processing section 37 is disposed rearward of the first processing section 34. The second processing section 37 is positioned so as not to overlap the first processing section 34 in plan view. The second right processing section 37R is disposed rearward of the first right processing section 34R. The first right processing section 34R and the second right processing section 37R are arranged in the forward/rearward direction X along the transportation space 45. The second left processing section 37L is disposed rearward of the first left processing section 34L. The first left processing section 34L and the second left processing section 37L are arranged in the forward/rearward direction X along the transportation space 45.

The second mount table 41 is disposed between the first transport mechanism 46 and the second transport mechanism 48. The second mount table 41 is disposed leftward and rearward of the first transport mechanism 46. The second mount table 41 is disposed leftward and forward of the second transport mechanism 48.

The second mount table 41, the first transport mechanism 46, and the second transport mechanism 48 are arranged in a triangle shape in plan view. Specifically, the second mount table 41, the first transport mechanism 46, and the second transport mechanism 48 are each positioned at a vertex of a virtual triangle (specifically, acute triangle) in plan view.

The second mount table 41 is positioned so as to overlap the first processing section 34 and the second processing section 37 in plan view. Specifically, the second mount table 41 includes a first portion 41a overlapped on the first processing section 34 in plan view, and a second portion 41b overlapped on the second processing section 37 in plan view. More specifically, the first portion 41a of the second mount table 41 overlaps the first left processing section 34L in plan view. The second portion 41b of the second mount table 41 overlaps the second left processing section 37L in plan view.

Moreover, the second mount table 41 protrudes into the transportation space 45. Specifically, the second mount table 41 includes a third portion 41c overlapped on the transportation space 45 in plan view. The third portion 41c of the second mount table 41 does not overlap the first processing section 34 and the second processing section 37 in plan view. The third portion 41c of the second mount table 41 protrudes toward the transportation space 45 beyond the first left processing section 34L and the second left processing section 37L.

The second mount table 41 is disposed at a position by a substantially equal distance from the first transport mechanism 46 and the second transport mechanism 48. Specifically, the distance between the first transport mechanism 46 and the second mount table 41 is substantially equal to the distance between the second transport mechanism 48 and the second mount table 41 in plan view.

The first processing section 34 includes a plurality of (e.g., two) first processing units 35 that performs treatment to each of the substrates W. The first processing units 35 are the edge exposure treating unit. Each of the first processing units 35 performs edge exposure treatment to one substrate W. One of the first processing units 35 is disposed rightward of the first transport mechanism 46. The first processing unit 35 disposed rightward of the first transport mechanism 46 belongs to the first right processing section 34R. The other of the first processing units 35 is disposed leftward of the first transport mechanism 46. The first processing unit 35 disposed leftward of the first transport mechanism 46 belongs to the first left processing section 34L.

The first processing units 35 each include a spin holder 36a, and a light irradiator 36b. The spin holder 36a holds one substrate W horizontally. The spin holder 36a is capable of rotating the held substrate W. A rotation axis of the substrate W is substantially parallel to the upward/downward direction Z. The light irradiator 36b applies light to a peripheral edge of the substrate W held by the spin holder 36a. The light applied from the light irradiator 36b causes the peripheral edge of the substrate W to be exposed to light.

The second processing section 37 includes a plurality of (e.g., nine) second processing units 38 that performs treatment to each of the substrates W. The second processing units 38 are the heat treating unit. Each of the second processing units 38 performs heat treatment to one substrate W. The heat treating units are arranged in line the in the upward/downward direction Z.

Reference is made to FIGS. 7 and 8. Five second processing units 38 are disposed rightward of the second transport mechanism 48. The second processing units 38 disposed rightward of the second transport mechanism 48 belong to the second right processing section 37R. All the second heat processing units 38 belonging to the second right processing section 37R are arranged in line the in the upward/downward direction Z.

Reference is made to FIGS. 5 and 8. The remaining four second processing units 38 are disposed leftward of the second transport mechanism 48. The second processing unit 38 disposed leftward of the second transport mechanism 48 belongs to the second left processing section 37L. All the second processing units 38 belonging to the second left processing section 37L are arranged in line the in the upward/downward direction Z.

Reference is made to FIGS. 4 and 8. The second processing units 38 each include a first plate 39a and a second plate 39b. One substrate W is placed on the first plate 39a horizontally. One substrate W is placed on the second plate 39b horizontally. The first plate 39a and the second plate 39b are disposed in the width direction Y. The first plate 39a is disposed closer to the transportation space 45 than the second plate 39b. The second processing units 38 each include a local transport mechanism, not shown. The local transport mechanism transports the substrate W between the first plate 39a and the second plate 39b. Moreover, the second processing units 38 each include a temperature regulator, not shown. The temperature regulator is attached to the second plate 39b. The temperature regulator regulates the temperature of the second plate 39b. Examples of the temperature regulator include a heater. Accordingly, the second plate 39b is capable of heating the substrate W placed on the second plate 39b to a given temperature.

Reference is made to FIGS. 5 and 8. The second mount table 41 includes a plurality of (e.g., two) plates 42a, 42b. One substrate W is placed on the plates 42a, 42b, respectively, horizontally. The plates 42a, 42b are arranged in the upward/downward direction Z. The plate 42b is disposed below the plate 42a. The plate 42b overlaps the plate 42a in plan view.

Reference is made to FIGS. 5, 7, and 8. The substrate treating apparatus 1 further includes slots 43a to 43j, and slots 44a to 44j. The slots 43a to 43c, 43f to 43h support the first processing section 34. The slots 43a to 43c, 43f to 43h function as a shell or a stay for installing the first processing section 34. The slots 44a to 44h, and 44j support the second processing section 37. The slots 44a to 44h, and 44j function as a shell or a stay for installing the second processing section 37. The slots 43i and 44i support the second mount table 41. The slots 43i and 44i function as a shell or a stay for installing the second mount table 41. The slots 43a to 43j, 44a to 44j have substantially the same shape and configuration.

When no distinction is made among the slots 43a to 43i, they are referred to as a "slot 43". When no distinction is made among the slots 44a to 44i, they are referred to as a "slot 44".

The slot 43 is disposed laterally of the first transport mechanism 46. The transport slot 43 and the first transport mechanism 46 are arranged in the width direction Y. The slots 43a to 43e are disposed rightward of the first transport mechanism 46. The slots 43f to 43i are disposed leftward of the first transport mechanism 46. The slot 44 is disposed laterally of the second transport mechanism 48. The slot 44 and the second transport mechanism 48 are arranged in the width direction Y. The slots 44a to 44e are disposed rightward of the second transport mechanism 48. The slots 44f to 44i are disposed leftward of the second transport mechanism 48.

Reference is made to FIG. 7. The slots 43a to 43e are arranged in line in the upward/downward direction Z. The slots 43a, 43b, 43c, 43d, 43e are arranged in this order from the top to the bottom. The slot 43a is arranged at the highest position among the slots 43a to 43e. The slot 43e is arranged at the lowest position among the slots 43a to 43e.

Reference is made to FIG. 5. The slots 43f to 43j are arranged in line in the upward/downward direction Z. The slots 43f, 43g, 43h, 43i, 43j are arranged in this order from the top to the bottom. The slot 43f is arranged at the highest position among the slots 43f to 43j. The slot 43j is arranged at the lowest position among the slots 43f to 43j.

Reference is made to FIGS. 7 and 8. The slots 44a to 44e are arranged in line in the upward/downward direction Z. The slots 44a, 44b, 44c, 44d, 44e are arranged in this order from the top to the bottom. The slot 44a is arranged at the highest position among the slots 44a to 44e. The slot 44e is arranged at the lowest position among the slots 44a to 44e.

Reference is made to FIGS. 5 and 8. The slots 44f to 44j are arranged in line in the upward/downward direction Z. The slots 44f, 44g, 44h, 44i, 44j are arranged in this order from the top to the bottom. The slot 44f is arranged at the highest position among the slots 44f to 44j. The slot 44j is arranged at the lowest position among the slots 44f to 44j.

The slot 43 and the slot 44 are arranged in the forward/rearward direction X. The slot 44 is disposed rearward of the slot 43. Specifically, the slot 43a and the slot 44a are arranged in the forward/rearward direction X. The slot 44a is disposed rearward of the slot 43a. The slot 44a is disposed at the same level as that of the slot 43a. Likewise, the slots 43b to 43e and the slots 44b to 44e are arranged in the forward/rearward direction X. The slots 44b to 44e are disposed rearward of the slots 43b to 43e, respectively. The slots 44b to 44e are disposed at the same level as that of the slots 43b to 43e, respectively. The slots 43f to 43i and the slots 44f to 44i are arranged in the forward/rearward direction X. The slots 44f to 44i are disposed rearward of the slots 43f to 43i, respectively. The slots 44f to 44i are disposed at the same level as that of the slots 43f to 43i, respectively.

Reference is made to FIGS. 5 and 7. One first processing unit 35 has a dimension corresponding to three successive slots 43 in the upward/downward direction Z. The first processing unit 35 belonging to the first right processing section 34R is disposed across the slots 43a to 43c. A horizontal wall separating the slot 43a from the slot 43b and a horizontal wall separating the slot 43b from the slot 43c are omitted. The first processing unit 35 belonging to the first left processing section 34L is disposed across the slots 43f to 43h. A horizontal wall separating the slot 43f from the slot 43g and a horizontal wall separating the slot 43g from the slot 43h are omitted.

The slots 43d, 43e, 43j are opened. Neither the first processing unit 35 nor the second mount table 41 is disposed in the slots 43d, 43e, 43j.

Reference is made to FIGS. 5, 7, and 8. One second processing unit 38 has a dimension corresponding to one slot 44. The second processing units 38 are disposed in the slots 44a to 44h individually.

The second mount table 41 is disposed over the slots 43i, 44i. The second mount table 41 is disposed across the slots 43i, 44i. A vertical wall separating the slot 43i from the slot 44i is omitted. The first portion 41a of the second mount table 41 is accommodated in the slot 43i. The second portion 41b of the second mount table 41 is accommodated in the slot 44i. The third portion 41c of the second mount table 41 protrudes from the slots 43i, 44i.

The slots 43f to 43i are one example of the first slot in the present invention. Especially, three of the first slots (specifically, slots 43f to 43h) are one example of a first treating slot in the present invention. Especially, the other one of the first slots (specifically, slot 43i) is one example of a first mounting slot in the present invention. The slots 44f to 44i are one example of the second slot in the present invention. Especially, four of the second slots (specifically, slots 44f to 44h, 44j) are one example of a second treating slot in the present invention. The other one of the second slots (specifically, slot 44i) is one example of a second mounting slot in the present invention.

Figure 9:
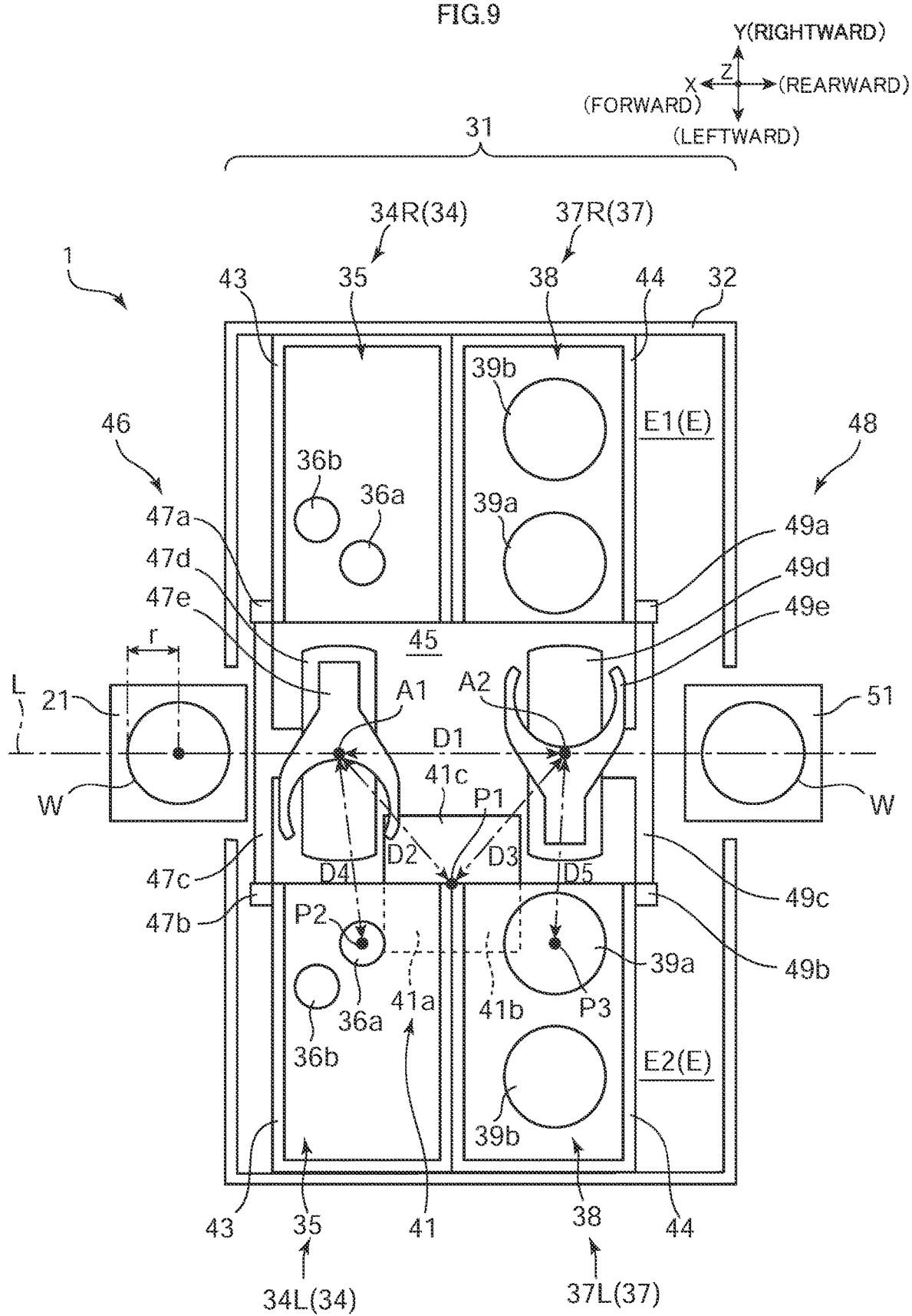
FIG. 9 is a plan view of the first block.

Reference is made to FIGS. 6 and 9. FIG. 9 is a plan view of the first block 31. The first transport mechanism 46 includes first struts 47a, 47b, a first lifting member 47c, a first rotator 47d, and first holders 47e, 47f. The first struts 47a, 47b extend in the upward/downward direction Z. The first struts 47a, 47b are arranged in the width direction Y. The first struts 47a, 47b are disposed in a fixed manner. Accordingly, the first struts 47a, 47b are immovable. Specifically, the first struts 47a, 47b are fixed on the first frame 32. The first struts 47a, 47b are immovable with respect to the first frame 32. The first lifting member 47c is supported on the first struts 47a, 47b. The first lifting member 47c is movable with respect to the first struts 47a, 47b. The first lifting member 47c is movable in the upward/downward direction Z. The first lifting member 47c is immovable in the horizontal direction. The first rotator 47d is supported on the first lifting member 47c. The first rotator 47d is rotatable with respect to the first lifting member 47c. The first rotator 47d is rotatable around the first axis A1. The first axis A1 is parallel to the upward/downward direction Z. The first rotator 47d is immovable in the horizontal direction. The first axis A1 is immovable in the horizontal direction. The first holders 47e, 47f are supported on the first rotator 47d. The first holders 47e, 47f are capable of reciprocating with respect to the first rotator 47d in the horizontal direction. The first holders 47e, 47f are capable of reciprocating independently. The first holders 47e, 47f each contact to the substrate W. The first holders 47e, 47f each hold one substrate W horizontally.

Reference is made to FIGS. 6, 8, and 9. The second transport mechanism 48 includes second struts 49a, 49b, a second lifting member 49c, a second rotator 49d, and second holders 49e, 49f. The second struts 49a, 49b extend in the upward/downward direction Z. The second struts 49a, 49b are arranged in the width direction Y. The second struts 49a, 49b are disposed in a fixed manner. Accordingly, the second struts 49a, 49b are immovable. Specifically, the second struts 49a, 49b are fixed on the first frame 32. The second struts 49a, 49b are immovable with respect to the first frame 32. The second lifting member 49c is supported on the second struts 49a, 49b. The second lifting member 49c is movable with respect to the second struts 49a, 49b. The second lifting member 49c is movable in the upward/downward direction Z. The second lifting member 49c is immovable in the horizontal direction. The second rotator 49d is supported on the second lifting member 49c. The second rotator 49d is rotatable with respect to the second lifting member 49c. The second rotator 49d is rotatable around the second axis A2. The second axis A2 is parallel to the upward/downward direction Z. The second rotator 49d is immovable in the horizontal direction. The second axis A2 is immovable in the horizontal direction. The second holders 49e, 49f are supported on the second rotator 49d. The second holders 49e, 49f are capable of reciprocating with respect to the second rotator 49d in the horizontal direction. The second holders 49e, 49f are capable of reciprocating independently. The second holders 49e, 49f each contact to the substrate W. The second holders 49e, 49f each hold one substrate W horizontally.

Reference is made to FIGS. 5 and 7. Moreover, the first processing units 35 are each positioned so as to overlap the first axis A1 in side view. That is, all the first processing units 35 overlap the first axis A1 in side view. The second processing units 38 are each positioned so as to overlap the second axis A2 in side view. That is, all the second processing units 38 overlap the second axis A2 in side view.

Reference is made to FIG. 9. FIG. 9 illustrates a virtual line L connecting the first axis A1 and the second axis A2. The virtual line L is parallel to the forward/rearward direction X in plan view. The second mount table 41 is positioned so as not to overlap the virtual line L in plan view. The second mount table 41 is arranged leftward of the virtual line L in plan view.

A distance D1 between the first axis A1 and the second axis A2 is five times or less a radius r of the substrate W in plan view. The distance D1 between the first axis A1 and the second axis A2 is four times or more the radius r of the substrate W in plan view.

The second mount table 41 is disposed at a position by a substantially equal distance from the first axis A1 and the second axis A2 in plan view. Specifically, the distance between the first axis A1 and the second mount table 41 is substantially equal to the distance between the second axis A2 and the second mount table 41 in plan view.

Here, a central point of the substrate W placed on the second mount table 41 is referred to as a "point P1". A distance D2 between the first axis A1 and the point P1 is substantially equal to a distance D3 between the second axis A2 and the point P1 in plan view. For instance, the difference between the distance D2 and the distance D3 is equal to or less than the radius r of the substrate W.

The first axis A1 is disposed at a position by a substantially equal distance from the second mount table 41 and the first processing section 34 in plan view. Specifically, the distance between the first axis A1 and the second mount table 41 is substantially equal to the distance between the first axis A1 and the processing section 34 in plan view.

Here, a central point of the substrate W placed on the spin holder 36a is referred to as a "point P2". The distance D2 between the first axis A1 and the point P1 is substantially equal to a distance D4 between the first axis A1 and the point P2 in plan view. The difference between the distance D2 and the distance D4 is equal to or less than the radius r of the substrate W.

The second axis A2 is disposed at a position by a substantially equal distance from the second mount table 41 and the second processing section 37 in plan view. Specifically, the distance between the second axis A2 and the second mount table 41 is substantially equal to the distance between the second axis A2 and the second processing section 37 in plan view.

Here, a central point of the substrate W placed on the first plate 39a is referred to as a "point P3". The distance D3 between the second axis A2 and the point P1 is substantially equal to a distance D5 between the second axis A2 and the point P3 in plan view. The difference between the distance D3 and the distance D5 is equal to or less than the radius r of the substrate W.

Reference is made to FIGS. 4 and 9. The substrate treating apparatus 1 further includes a space E. The space E is formed in the first block 31. The space E is disposed rearward of the second processing section 37. The space E is disposed lateral of the transportation space 45.

The space E includes a space section E1 and a space section E2. The space section E1 is formed rearward of the second right processing section 37R and rightward of the transportation space 45. The space section E2 is formed rearward of the second left processing section 37L and leftward of the transportation space 45.

<Second Block 61>

Figure 10:
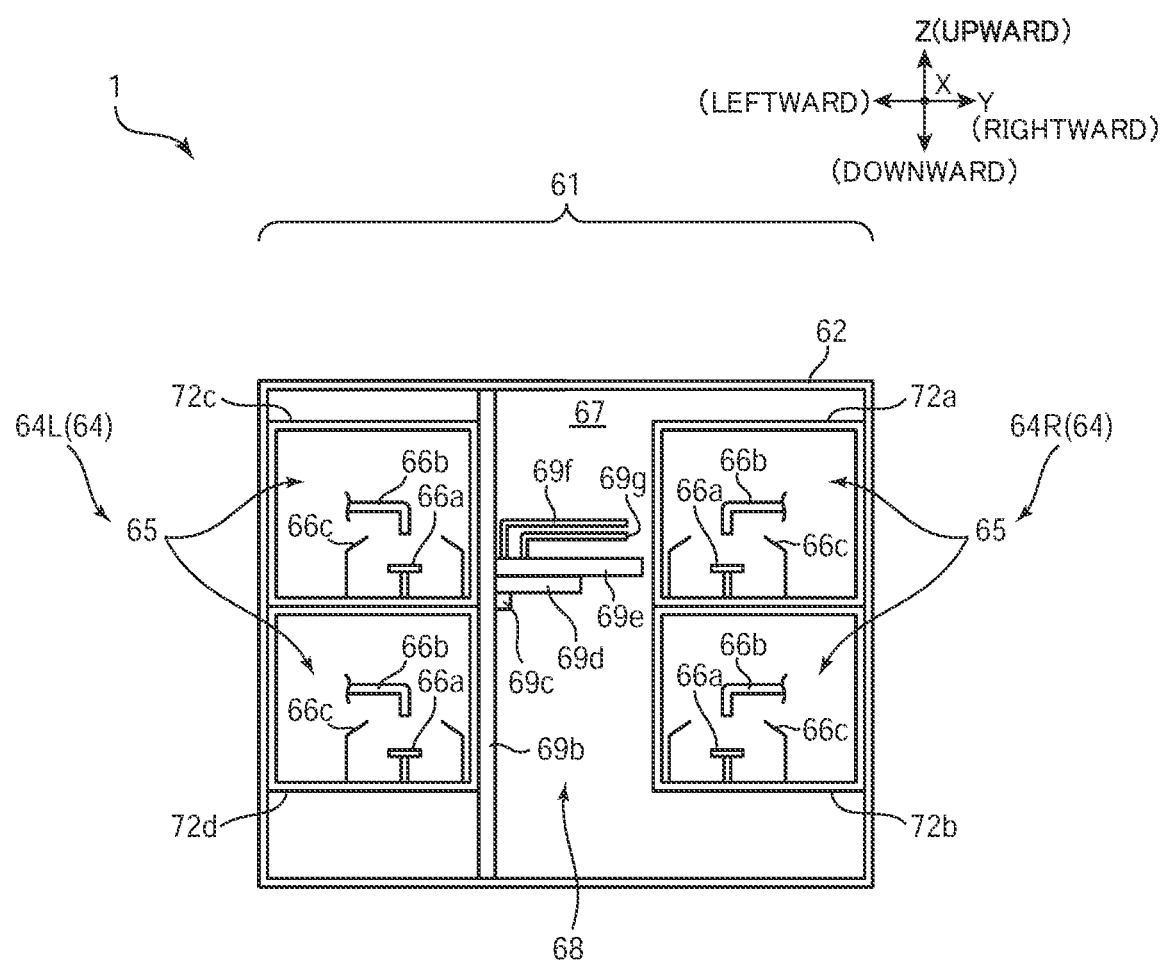
FIG. 10 is a rear view of a second block.

Reference is made to FIGS. 4 to 7, and 10. FIG. 10 is a rear view of a second block 61. The second block 61 has substantially a box shape. The second block 61 is substantially rectangular in plan view, in front view, and in side view.

The second block 61 has a second frame 62. The second frame 62 is provided as a shell (contour) of the second block 61. The second frame 62 defines the shape of the second block 61. The second frame 62 is, for example, made of metal.

The second frame 62 is connected to the first frame 32. The second frame 62 supports the third processing section 64 and the third transport mechanism 68.

The substrate treating apparatus 1 further includes a transportation space 67. The transportation space 67 is formed in the second block 61. The transportation space 67 is formed laterally of the third processing section 64. More specifically, the transportation space 67 is disposed in the middle of the second block 61 in the width direction Y. The transportation space 67 extends in the forward/rearward direction X. The transportation space 67 extends from a front part of the second block 61 to a rear part of the second block 61. The transportation space 67 contacts to the transportation space 45. The transportation space 67 and the third processing section 64 are arranged in the width direction Y.

The third transport mechanism 68 is disposed in the transportation space 67. The third transport mechanism 68 is disposed rearward of the second transport mechanism 48. The first transport mechanism 46, the second transport mechanism 48, and the third transport mechanism 68 are disposed in line in the forward/rearward direction X. The second transport mechanism 48 is disposed between the first transport mechanism 46 and the third transport mechanism 68.

The third processing section 64 is disposed laterally of the third transport mechanism 68. More specifically, the third processing section 64 and the third transport mechanism 46 are arranged in the width direction Y. The third processing section 64 is disposed rightward and leftward of the third transport mechanism 68. The third processing section 64 disposed rightward of the third transport mechanism 68 is referred to as a "third right processing section 64R". The third processing section 64 disposed leftward of the third transport mechanism 68 is referred to as a "third left processing section 64L". The third right processing section 64R, the third transport mechanism 68, and the third left processing section 64L are arranged in the width direction Y. The third transport mechanism 68 is arranged between the third right processing section 64R and the third left processing section 64L.

The third right processing section 64R has a length G1 in the forward/rearward direction X that is smaller than a length G2 of the third left processing section 64L in the forward/rearward direction X. The length G1 of the third right processing section 64R in the forward/rearward direction X is preferably smaller than the length G2 of the third left processing section 64L in the forward/rearward direction X by 500*m* or more. That is, the difference between the length G1 and the length G2 is preferably 500*mm* or more. The length G2 is, for example, approximately one-and-a-half times larger than the length G1.

The third right processing section 64R is one example of the third short processing section in the present invention. The third left processing section 64L is one example of the third long processing section in the present invention.

The substrate treating apparatus 1 includes the space F. The space F is formed in the second block 61. The space F and the third right processing section 64R are arranged in the forward/rearward direction X. The space F is disposed forward of the third right processing section 64R. The space F is disposed lateral of the third transportation space 67. The space F and the third transportation space 67 are arranged in the width direction Y. The space F is disposed rightward of the transportation space 67. The space F is disposed lateral of the third transport mechanism 68. The space F and the third transport mechanism 68 are arranged in the width direction Y. The space F is disposed rightward of the third transport mechanism 68. The space F, the transportation space 67, and the third left processing section 64L are arranged in the width direction Y. The space F faces to the third left processing section 64L across the transportation space 67. The transportation space 67 is arranged between the space F and the third left processing section 64L. The space F preferably has a dimension where human beings (e.g., an operator of the substrate treating apparatus 1) are capable of entering.

The space F is one example of the maintenance space in the present invention.

The second processing section 37 and the third processing section 64 are arranged in the forward/rearward direction X. The third processing section 64 is disposed rearward of the second processing section 37. The second right processing section 37R and the third right processing section 64R are arranged in the forward/rearward direction X. The third right processing section 64R is disposed rearward of the second right processing section 37R. The first right processing section 34R, the second right processing section 37R, and the third right processing section 64R are arranged in line in the forward/rearward direction X. The second left processing section 37L and the third left processing section 64L are arranged in the forward/rearward direction X. The third left processing section 64L is disposed rearward of the second left processing section 37L. The first left processing section 34L, the second left processing section 37L, and the third left processing section 64L are arranged in line in the forward/rearward direction X.

The space E and the space F are arranged between the second processing section 37 and the third processing section 64. The space section E1 and the space F are arranged between the second right processing section 37R and the third right processing section 64R. The second right processing section 37R, the space section E1, the space F, and the third right processing section 64R are arranged in the forward/rearward direction X. The second right processing section 37R, the space section E1, the space F, and the third right processing section 64R are arranged in line in this order. The space section E2 is arranged between the second left processing section 37L and the third left processing section 64L. The second left processing section 37L, the space section E2, and the third left processing section 64L are arranged in the forward/rearward direction X. The second left processing section 37L, the space section E2, and the third left processing section 64L are arranged in line in this order.

The spaces E, F are one example of the heat insulation space in the present invention. The space F is one example of the maintenance space and one example of the heat insulation space in the present invention. That is, the space F serves both as the maintenance and the heat insulation space in the present invention.

The substrate treating apparatus 1 further includes an inspection hole 71 and a lid 72. The inspection hole 71 is formed in the second block 61. The inspection hole 71 is an opening formed on a right wall of the second block 61. The inspection hole 71 preferably has a dimension where the operator is capable of passing. The lid 72 is attached to the second block 61. The lid 72 is attached to the right wall of the second block 61. The lid 72 is rotatable with respect to the second block 61. The lid 72 allows opening/closing of the inspection hole 71.

The third processing section 64 includes a plurality of (e.g., ten) third processing units 65 that perform treatment to each of the substrates W. Each of the third processing units 65 performs liquid treatment to one substrate W. More specifically, each of the third processing units 65 performs a developing process to one substrate W.

Reference is made to FIG. 7. Four third processing units 65 are disposed rightward of the third transport mechanism 68. The third processing units 65 disposed rightward of the third transport mechanism 68 all belong to the third right processing section 64R.

The third processing units 65 belonging to the third right processing section 64R are arranged in a matrix array in the forward/rearward direction X and the upward/downward direction Z. Two of the third processing units 65 are arranged on an upper layer of the third right processing section 64R. The remaining two of the third processing units 65 are arranged on a lower layer of the third right processing section 64R. The third processing units 65 on the upper layer of the third right processing section 64R are arranged in the forward/rearward direction X. The third processing units 65 on the lower layer of the third right processing section 64R are arranged in the forward/rearward direction X. The two third processing units 65 on the lower layer of the third right processing section 64R overlap the two third processing units 65 arranged on the upper layer of the third right processing section 64R in the plan view.

Reference is made to FIG. 5. Six third processing units 65 are disposed leftward of the third transport mechanism 68. The third processing units 65 disposed leftward of the third transport mechanism 68 all belong to the third left processing section 64L.

The third processing units 65 belonging to the third left processing section 64L are arranged in a matrix array in the forward/rearward direction X and the upward/downward direction Z. Three of the third processing units 65 are arranged on an upper layer of the third left processing section 64L. The remaining three of the third processing units 65 are arranged on a lower layer of the third left processing section 64L. The three third processing units 65 on the upper layer of the third left processing section 64L are arranged in the forward/rearward direction X. The three third processing units 65 on the lower layer of the third left processing section 64L are arranged in the forward/rearward direction X. The three third processing units 65 on the lower layer of the third left processing section 64L overlap the three third processing units 65 arranged on the upper layer of the third left processing section 64L in the plan view.

The third processing units 65 each include a spin holder 66a, a nozzle 66b, and a cup 66c. The spin holder 66a holds one substrate W horizontally. The spin holder 66a is capable of rotating the held substrate W. A rotation axis of the substrate W is substantially parallel to the upward/downward direction Z. The nozzle 66b dispenses a treatment liquid to the substrate W. Examples of the treatment liquid include a developer. The nozzle 66b is positioned at a treatment position and a retracted position in a movable manner. The treatment position is above the substrate W held by the spin holder 66a. The treatment position overlaps the substrate W held by the spin holder 66a in plan view. The retracted position does not overlap the substrate W held by the spin holder 66a in plan view. The cup 66c surrounds the spin holder 66a. The cup 66c collects the treatment liquid.

The substrate treating apparatus 1 further includes a plurality of chambers (casings) 72a to 72d. The chambers 72a to 72d are disposed lateral of the transportation space 67.

Reference is made to FIGS. 7 and 10. The chambers 72a, 72b are disposed rightward of the transport transportation space 67. The chambers 72a, 72b are arranged in the upward/downward direction Z. The chamber 72b is disposed below the chamber 72a. The chamber 72a accommodates two of the third processing units 65 arranged on the upper layer of the third right processing section 64R. The chamber 72b accommodates two of the third processing units 65 arranged on the lower layer of the third right processing section 64R.

Reference is made to FIGS. 5 and 10. The chambers 72c, 72d are disposed leftward of the transport transportation space 67. The chambers 72c, 72d are arranged in the upward/downward direction Z. The chamber 72d is disposed below the chamber 72c. The chamber 72c accommodates three of the third processing units 65 arranged on the upper layer of the third left processing section 64L. The chamber 72d accommodates three of the third processing units 65 arranged on the lower layer of the third left processing section 64L.

Reference is made to FIGS. 4, 6, and 10. The third transport mechanism 68 includes third struts 69a, 69b, a third lifting member 69c, a third horizontal moving member 69d, a third rotator 69e, and third holders 69f, 69g. The third struts 69a, 69b extend in the upward/downward direction Z. The third struts 69a, 69b are arranged in the forward/rearward direction X. The third struts 69a, 69b are disposed closer to the third left processing section 64L than to the third right processing section 64R. The third strut 69a is arranged in a left front side of the transportation space 67. The third strut 69b is arranged in a left rear part of the transportation space 67. The third struts 69a, 69b are disposed in a fixed manner. Accordingly, the third struts 69a, 69b are immovable. Specifically, the third struts 69a, 69b are fixed on the second frame 62. The third struts 69a, 69b are immovable with respect to the second frame 62. The third lifting member 69c extends in the forward/rearward direction X. The third lifting member 69c is supported on the third struts 69a, 69b. The third lifting member 69c is movable with respect to the third struts 69a, 69b. The third lifting member 69c is movable in the upward/downward direction Z. The third lifting member 69c is immovable in the horizontal direction. The third horizontal moving member 69d is supported on the third lifting member 69c. The third horizontal moving member 69d is movable with respect to the third lifting member 69c. The third horizontal moving member 69d is movable in the horizontal direction (specifically, the forward/rearward direction X). The third rotator 69e is supported on the third horizontal moving member 69d. Accordingly, the third rotator 69e is movable in the horizontal direction (specifically, the forward/rearward direction X). The third rotator 69e is rotatable with respect to a third horizontally moving member 69d. A rotation axis of the third rotator 69e is parallel to the upward/downward direction Z. The rotation axis of the third rotator 69e is movable in the forward/rearward direction X. The third holders 69f, 69g are supported on the third rotator 69e. The third holders 69f, 69g are capable of reciprocating with respect to the third rotator 69e in the horizontal direction. The third holders 69f, 69g are capable of reciprocating independently. The third holders 69f, 69g each contact to the substrate W. The third holders 69f, 69g each hold one substrate W horizontally.

<First Mount Table 21 and Third Mount Table 51>

The first mount table 21 is disposed between the indexer 11 and the first transport mechanism 46. The first mount table 21 is disposed over the indexer 11 and the first block 31. The first mount table 21 is disposed across the transportation space 13 of the indexer 11 and a transportation space 45 of the first block 31. A part of the first mount table 21 is disposed in the transportation space 13 of the indexer 11. The remaining part of the first mount table 21 is disposed in the transportation space 45 of the first block 31.

The first mount table 21 is disposed between the indexer transport mechanism 14A and the indexer transport mechanism 14B. The first mount table 21 is disposed rearward and leftward of the indexer transport mechanism 14A. The first mount table 21 is disposed rearward and rightward of the indexer transport mechanism 14B. The first mount table 21 is disposed at substantially the same interval from the indexer transport mechanisms 14A, 14B. Specifically, the distance between the indexer transport mechanism 14A and the first mount table 21 is substantially equal to the distance between the indexer transport mechanism 14B and the first mount table 21 in plan view.

The first mount table 21 and the first transport mechanism 46 are disposed in the forward/rearward direction X. The first mount table 21 is disposed forward of the first transport mechanism 46. The first mount table 21, the first transport mechanism 46, and the second transport mechanism 48 are disposed in line in the forward/rearward direction X. As illustrated in FIG. 9, the first mount table 21 is positioned so as to overlap the virtual line L in plan view.

The third mount table 51 is disposed between the second transport mechanism 48 and the third transport mechanism 68. The third mount table 51 is disposed between the first block 31 and the second block 61. The third mount table 51 is disposed across the transportation space 45 of the first block 31 and a transportation space 67 of the second block 61. The part of the third mount table 51 is disposed in the transportation space 45 of the first block 31. The remaining part of the third mount table 51 is disposed in the transportation space 67 of the second block 61.

The third mount table 51 is disposed rearward of the second transport mechanism 48. The first transport mechanism 46, the second transport mechanism 48, and the third mount table 51 are disposed in line in the forward/rearward direction X. As illustrated in FIG. 9, the third mount table 51 is positioned so as to overlap the virtual line L in plan view.

The third mount table 51 is disposed forward of the third transport mechanism 68. The second transport mechanism 48, third mount table 51, and the third transport mechanism 68 are disposed in line in the forward/rearward direction X.

Reference is made to FIG. 6. The first mount table 21 includes a plurality of plates 22a, 22b. One substrate W is placed on the plates 22a, 22b, respectively, horizontally. The plates 22a, 22b are arranged in the upward/downward direction Z. The plate 22b is disposed below the plate 22a. The plate 22b overlaps the plate 22a in plan view.

The third mount table 51 includes a plurality of plates 52a, 52b. One substrate W is placed on the plates 52a, 52b, respectively, horizontally. The plates 52a, 52b are arranged in the upward/downward direction Z. The plate 52b is disposed below the plate 52a. The plate 52b overlaps the plate 52a in plan view.

<Transport Mechanism>

Reference is made to FIG. 4. The following describes in summary the mount table and the processing section where the first transport mechanism 46, the second transport mechanism 48, and the third transport mechanisms 68 are accessible. The following describes in summary the mount table and the processing section where the first transport mechanism 46, the second transport mechanism 48, and the third transport mechanisms 68 are inaccessible.

The first transport mechanism 46 is accessible to the first mount table 21. The first transport mechanism 46 is accessible to the plates 22a, 22b of the first mount table 21. The first transport mechanism 46 is accessible to the first processing units 35. The first transport mechanism 46 is accessible to the spin holders 36a of the first processing units 35.

The first transport mechanism 46 is accessible to the second mount table 41. The first transport mechanism 46 is accessible to the plates 42a, 42b of the second mount table 41.

The second transport mechanism 48 is accessible to the second mount table 41. The second transport mechanism 48 is accessible to the plates 42a, 42b of the second mount table 41. The second transport mechanism 48 is accessible to the second processing units 38. The second transport mechanism 48 is accessible to the first plates 39a of the second processing units 38. The second transport mechanism 48 is accessible to the third mount table 51. The second transport mechanism 48 is accessible to the plates 52a, 52b of the third mount table 51.

The third transport mechanism 68 is accessible to the third mount table 51. The third transport mechanism 68 is accessible to the plates 52a, 52b of the third mount table 51. The third transport mechanism 68 is accessible to the third processing units 65. The third transport mechanism 68 is accessible to the spin holders 66a of the third processing units 65.

FIG. 4 illustrates by alternate long and short dash lines a first area B1 where the first transport mechanism 46 is capable of transporting the substrates W. The first transport mechanism 46 is incapable of transporting the substrates W out of the first area B1. The substrates W are moved within the first area B1 by the first transport mechanism 46. The first area B1 is substantially circular in plan view. The center of the first area B1 substantially conforms to the first axis A1 in plan view. The first mount table 21, the first processing section 34, and the second mount table 41 are disposed within the first area B1. At least a part of the first plates 39a of the second processing section 37 is disposed out of the first area B1. As noted above, the second processing section 37 is disposed out of the first area B1 of the first transport mechanism 46. That is, the first transport mechanism 46 is inaccessible to the second processing section 37. Likewise, the third processing section 64 is disposed out of the first area B1 in plan view. That is, the first transport mechanism 46 is inaccessible to the third processing section 64. The third mount table 51 is disposed out of the first area B1 in plan view. That is, the first transport mechanism 46 is inaccessible to the third mount table 51.

FIG. 4 illustrates by alternate long and short dashed lines a second area B2 where the second transport mechanism 48 is capable of transporting the substrates W. The second area B2 is substantially circular in plan view. The center of the second area B2 substantially conforms to the second axis A2 in plan view. The second mount table 41, the second processing section 37, and the third mount table 51 are disposed within the second area B2. The spin holders 36a of the first processing section 34 are disposed out of the second area B2 of the second transport mechanism 48. That is, the second transport mechanism 48 is inaccessible to the first processing section 34. Likewise, the third processing section 64 is disposed out of the second area B2 in plan view. That is, the second transport mechanism 48 is inaccessible to the third processing section 64. The first mount table 21 is disposed out of the second area B2 in plan view. That is, the second transport mechanism 48 is inaccessible to the first mount table 21.

FIG. 4 illustrates by alternate long and short dashed lines a third area B3 where the third transport mechanism 68 is capable of transporting the substrates W. The third area B3 is longitudinal in the forward/rearward direction X in plan view. The third area B3 has a length in the forward/rearward direction X that is larger than a length thereof in the width direction Y in plan view. The third mount table 51, and the third processing section 64 are disposed within the third area B3. The first processing section 34 and the second processing section 37 are disposed out of the third area B3 of the third transport mechanism 68. That is, the third transport mechanism 68 is inaccessible to the first processing section 34 and the second processing section 37. Likewise, the first mount table 21 and the second mount table 41 are disposed out of the third area B3. That is, the third transport mechanism 68 is inaccessible to the first mount table 21 and the second mount table 41.

<Other Effect of First Embodiment>

The primary effect of the first embodiment has already been described as above. The following describes other effects of the first embodiment.

The first processing section 34 is disposed out of the second area B2. Accordingly, the first transport mechanism 46 is accessible to the first processing section 34 without any interference with the second transport mechanism 48.

The first processing section 34 is disposed out of the third area B3. Accordingly, the first transport mechanism 46 is accessible to the first processing section 34 without any interference with the third transport mechanism 68.

The second processing section 37 is disposed out of the first area B1. Accordingly, the second transport mechanism 48 is accessible to the second processing section 37 without any interference with the first transport mechanism 46.

The second processing section 37 is disposed out of the third area B3. Accordingly, the second transport mechanism 48 is accessible to the second processing section 37 without any interference with the third transport mechanism 68.

The third processing section 64 is disposed out of the first area B1. Accordingly, the third transport mechanism 68 is accessible to the third processing section 64 without any interference with the first transport mechanism 46.

The third processing section 64 is disposed out of the second area B2. Accordingly, the third transport mechanism 68 is accessible to the third processing section 64 without any interference with the second transport mechanism 48.

The first mount table 21 is disposed out of the second area B2 and the third area B3. Accordingly, the first transport mechanism 46 is accessible to the first mount table 21 without any interference with the second transport mechanism 48 and the third transport mechanism 68.

The second mount table 41 is disposed out of the third area B3. Accordingly, the first transport mechanism 46 and the second transport mechanism 48 are accessible to the second mount table 41 without any interference with the third transport mechanism 68.

The third mount table 51 is disposed out of the first area B1. Accordingly, the second transport mechanism 48 and the third transport mechanism 68 are accessible to the third mount table 51 without any interference with the first transport mechanism 46.

The first area B1 is substantially circular in plan view. Accordingly, the first transport mechanism 46 is capable of performing the first, second, and third access operations efficiently. This allows the first transport mechanism 46 to perform the first cycle operation efficiently. In other words, much higher transportation efficiency by the first transport mechanism 46 is obtainable.

The second area B2 of the second transport mechanism 48 is substantially circular in plan view. Accordingly, the second transport mechanism 48 is capable of performing the fourth, fifth, and sixth access operations efficiently. This allows the second transport mechanism 48 to perform the second cycle operation efficiently. In other words, much higher transportation efficiency by the second transport mechanism 48 is obtainable.

The first transport mechanism 46 is disposed between the indexer 11 and the second transport mechanism 48. Accordingly, the substrate W is transportable suitably between the indexer 11 and the first transport mechanism 46 as well as between the first transport mechanism 46 and the second transport mechanism 48. Specifically, the first transport mechanism 46 is disposed rearward of the indexer 11. Accordingly, the substrate W is transportable suitably between the indexer 11 and the first transport mechanism 46. The second transport mechanism 48 is disposed rearward of the first transport mechanism 46. Accordingly, the substrate W is transportable suitably between the first transport mechanism 46 and the second transport mechanism 48.

The second transport mechanism 48 is disposed between the first transport mechanism 46 and the third transport mechanism 68. Specifically, the third transport mechanism 68 is disposed rearward of the second transport mechanism 48. Accordingly, the substrate W is transportable suitably between the second transport mechanism 48 and the third transport mechanism 68.

The first mount table 21 is disposed between the indexer 11 and the first transport mechanism 46. Accordingly, the indexer 11 and the first transport mechanism 46 allow easy access to the first mount table 21. The second mount table 41 is disposed between the first transport mechanism 46 and the second transport mechanism 48. Accordingly, the first transport mechanism 46 and the second transport mechanism 48 allow easy access to the second mount table 41. The third mount table 51 is disposed between the second transport mechanism 48 and the third transport mechanism 68. Accordingly, the second transport mechanism 48 and the third transport mechanism 68 allow easy access to the third mount table 51.

The first processing section 34 is disposed laterally of the first transport mechanism 46. Accordingly, the first transport mechanism 46 allows easy access to the first processing section 34. The second processing section 37 is disposed laterally of the second transport mechanism 48. Accordingly, the second transport mechanism 48 allows easy access to the second processing section 37. The third processing section 64 is disposed laterally of the third transport mechanism 68. Accordingly, the third transport mechanism 68 allows easy access to the third processing section 64.

The first transport mechanism 46 is arranged between the first right processing section 34R and the first left processing section 34L. Accordingly, the first transport mechanism 46 allows easy access to the first right processing section 34R and the first left processing section 34L. The second transport mechanism 48 is arranged between the second right processing section 37R and the second left processing section 37L. Accordingly, the second transport mechanism 48 allows easy access to the second right processing section 37R and the second left processing section 37L. The third transport mechanism 68 is arranged between the third right processing section 64R and the third left processing section 64L. Accordingly, the third transport mechanism 68 allows easy access to the third right processing section 64R and the third left processing section 64L.

The first transport mechanism 46, the second transport mechanism 48, and the second mount table 41 are arranged in a triangle shape in plan view. Accordingly, the distance between the first transport mechanism 46 and the second transport mechanism 48 can be reduced. Therefore, this achieves a small installation area (footprint) of the substrate treating apparatus 1.

The second mount table 41 is disposed laterally and rearward of the first transport mechanism 46. The second mount table 41 is disposed laterally and forward of the second transport mechanism 48. Accordingly, the distance between the first transport mechanism 46 and the second transport mechanism 48 in the forward/rearward direction X can be reduced. Therefore, this achieves a small installation area (footprint) of the substrate treating apparatus 1.

The first rotator 47d is immovable in the horizontal direction. Accordingly, the first transport mechanism 46 is capable of performing the first, second, and third access operations efficiently. This allows the first transport mechanism 46 to perform the first cycle operation efficiently.

The first processing units 35 are each positioned so as to overlap the first axis A1 of the first transport mechanism 46 in side view. Accordingly, the first transport mechanism 46 allows easy access to the first processing section 34.

The second rotator 49d is immovable in the horizontal direction. Accordingly, the second transport mechanism 48 is capable of performing the fourth, fifth, and sixth access operations efficiently. This allows the second transport mechanism 48 to perform the second cycle operation efficiently.

The second processing units 38 are each positioned so as to overlap the second axis A2 of the second transport mechanism 48 in side view. Accordingly, the second transport mechanism 48 allows easy access to the second processing section 37.

The second processing units 38 are the heat treating unit. The heat treating units are arranged the in the upward/downward direction Z. Accordingly, the second transport mechanism 48 allows easy access to the heat treating units individually.

The five second processing units 38 belonging to the second right processing section 37R are arranged rightward of the second transport mechanism 48 in line in the upward/downward direction Z. Accordingly, the second transport mechanism 48 allow easy access to the second processing units 38 arranged rightward of the second transport mechanism 48. Here, the second processing units 38 are the heat treating unit. Accordingly, the second transport mechanism 48 allow easy access to the heat treating units arranged rightward of the second transport mechanism 48.

The four second processing units 38 belonging to the second left processing section 37L are arranged leftward of the second transport mechanism 48 in line in the upward/downward direction Z. Accordingly, the second transport mechanism 48 allow easy access to the heat treating units arranged leftward of the second transport mechanism 48.

The distance D1 between the first axis A1 and the second axis A2 is five times or less a radius r of the substrate W in plan view. Accordingly, the distance between the first transport mechanism 46 and the second transport mechanism 48 can be reduced. Therefore, this achieves a small installation area of the substrate treating apparatus 1.

The second mount table 41 is positioned so as not to overlap the virtual line L connecting the first axis A1 and the second axis A2 in plan view. Accordingly, the distance between the first transport mechanism 46 and the second transport mechanism 48 can be reduced suitably.

The distance between the first axis A1 and the second mount table 41 is substantially equal to the distance between the second axis A2 and the second mount table 41 in plan view. Accordingly, the first transport mechanism 46 and the second transport mechanism 48 each allow easy access to the second mount table 41.

The second mount table 41 includes a first portion 41a overlapped on the first processing section 34 in plan view, and a second portion 41b overlapped on the second processing section 37 in plan view. Accordingly, the distance between the first transport mechanism 46 and the second transport mechanism 48 can be reduced. As a result, reduction in footprint of the substrate treating apparatus 1 is obtainable. Moreover, the first transport mechanism 46 and the second transport mechanism 48 each allow easy access to the second mount table 41.

The second mount table 41 includes third portion 41c not overlapped on the first processing section 34 and the second processing section 37 in plan view. Accordingly, the first transport mechanism 46 and the second transport mechanism 48 each allow easier access to the second mount table 41.

The third portion 41c of the second mount table 41 overlaps the transportation space 45 where the first transport mechanism 46 and the second transport mechanism 48 are disposed in plan view. Accordingly, the first transport mechanism 46 and the second transport mechanism 48 each allow easier access to the second mount table 41.

The substrate treating apparatus 1 includes the slots 43a to 43c, 43f to 43h. Accordingly, this achieves suitable installation of the first processing section 34 (specifically, the first processing units 35).

The substrate treating apparatus 1 includes the slots 44a to 44h, 44j. Accordingly, this achieves suitable installation of the second processing section 37 (specifically, the second processing units 38).

The substrate treating apparatus 1 includes the slots 43i and 44i. Accordingly, this achieves suitable installation of the second mount table 41.

The slots 43f to 43j are disposed laterally of the first transport mechanism 46. The slots 43f to 43j are arranged in line in the upward/downward direction Z. The first processing section 34 (first left processing section 34L) is disposed over the slots 43f to 43h. The second mount table 41 is disposed over the slot 43i. The slots 44f to 44j are disposed laterally of the second transport mechanism 48. The slots 44f to 44j are arranged in line in the upward/downward direction Z. The second processing section 37 (second left processing section 37L) is disposed over the slots 44f to 44h, 44j. The second mount table 41 is disposed also over the slot 44i. The slot 44i is disposed at the same level as that of the slot 43i. The second mount table 41 is disposed over the slots 43i, 44i. As noted above, the second mount table 41 is arrangeable suitably with a part of the slots 43a to 43j and a part of the slots 44a to 44j.

The slots 43f to 43j are arranged in the upward/downward direction Z. The slot 43i is arranged neither at the highest position nor the lowest position among the slots 43f to 43j. In other words, the slot 43i is arranged at a position other than the highest position and the lowest position among the slots 43f to 43j. The slots 44f to 44j are arranged in the upward/downward direction Z. The slot 44i is arranged neither at the highest position nor the lowest position among the slots 44f to 44j. In other words, the slot 44i is arranged at a position other than the highest position and the lowest position among the slots 44f to 44j. Accordingly, the first transport mechanism 46 allows easier access to the second mount table 41. Specifically, the first transport mechanism 46 is accessible to the second mount table 41 by a reduced amount of lifting movement. Likewise, the second transport mechanism 48 allows easier access to the second mount table 41.

The first processing section 34 is the edge exposing section. The second processing section 37 is the heat treating section. The third processing section 64 is the liquid treating section. Consequently, the edge exposing section and the heat treating section are arrangeable at a position relatively closer to the indexer 11. The liquid treating section is arrangeable at a position relatively farther from the indexer 11.

The substrate treating apparatus 1 includes the spaces E, F that separates the third processing section 64 from the second processing section 37. This achieves effective reduction in thermal influence on the third processing section 64 from the second processing section 37.

The substrate treating apparatus 1 includes the space F. This achieves suitable maintenance of the substrate treating apparatus 1.

The third right processing section 64R has the length G1 in the forward/rearward direction X that is smaller than the length G2 of the third left processing section 64L in the forward/rearward direction X. The space F and the third right processing section 64R are arranged in the forward/rearward direction X. Accordingly, this ensures the space F suitably.

The first block 31 accommodates the first processing section 34 and the second processing section 37. The second block 61 accommodates the third processing section 64. That is, the heat treating section (second processing section 37) and the liquid treating section (third processing section 64) are not accommodated in the same block. Accordingly, the heat treating section (second processing section 37) and the liquid treating section (third processing section 64) are capable of being disposed individually in a suitable manner.

The substrate treating apparatus 1 includes the first frame 32. Accordingly, the first frame 32 suitably constitutes the first block 31.

The substrate treating apparatus 1 includes the second frame 62. Accordingly, the second frame 62 suitably constitutes the second block 61.

Second Embodiment

The following describes one non-limiting embodiment of a substrate treating apparatus 1 according to a second embodiment with reference to drawings. Like numerals are used to identify like components which are the same as that in the first embodiment, and the components will not particularly be described.

<Summary of Substrate Treating Apparatus>

Figure 11A:
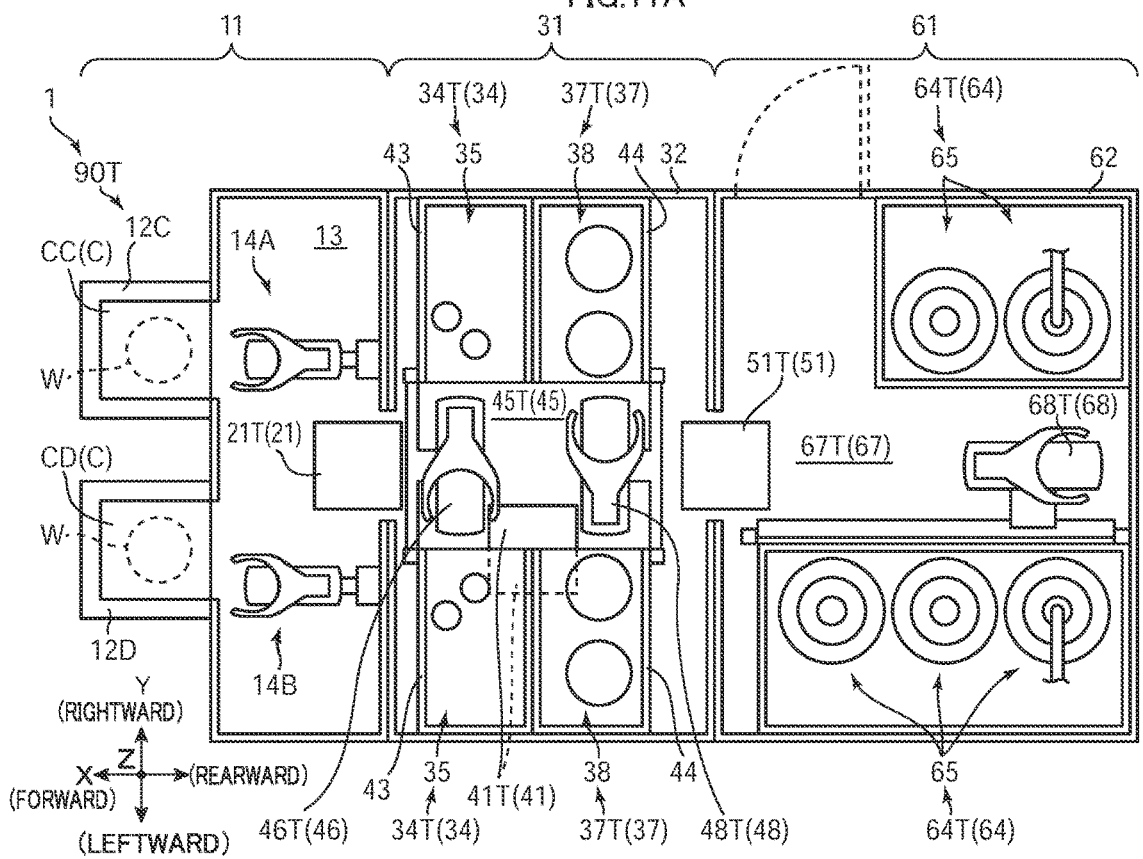
FIGS. 11A and 11B are each a plan view of a substrate treating apparatus according to a second embodiment.
Figure 11B:
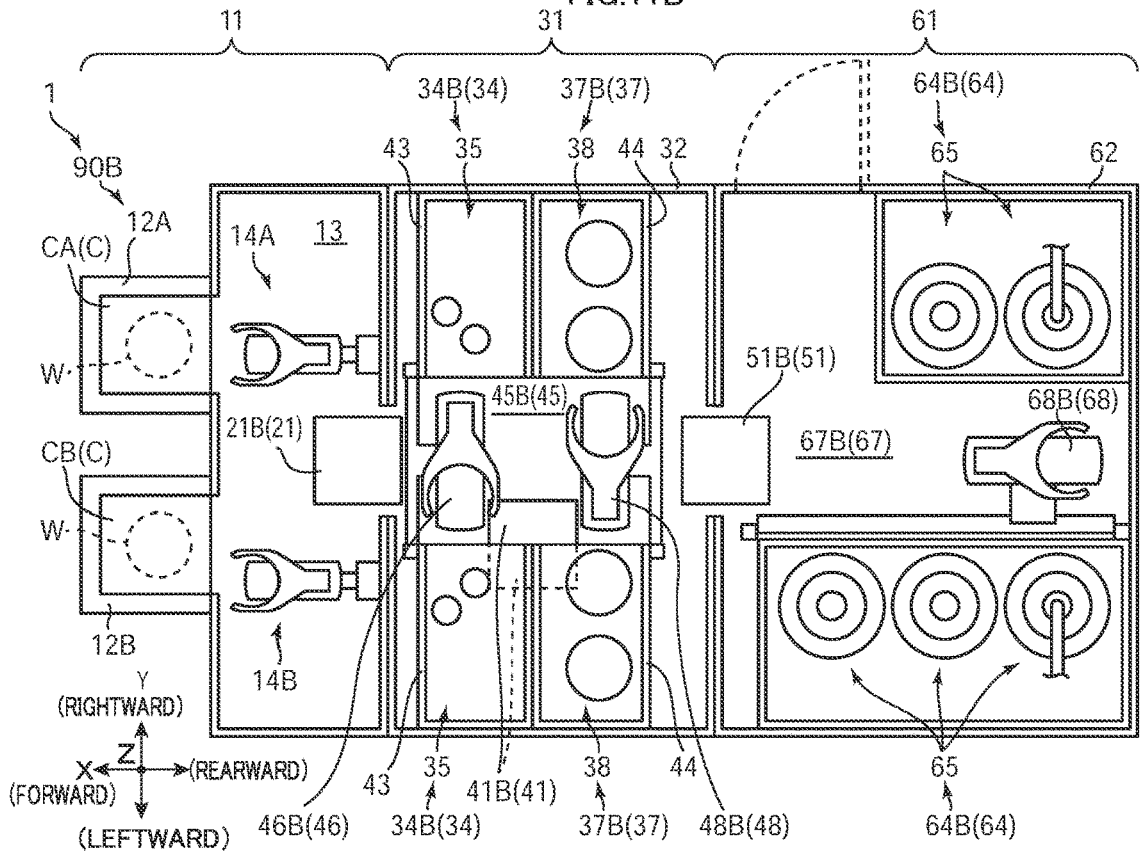

FIGS. 11A and 11B are each a plan view of a substrate treating apparatus 1 according to a second embodiment. The substrate treating apparatus 1 according to the second embodiment has a layered structure. The substrate treating apparatus 1 includes an upper layer 90T and a lower layer 90B. The lower layer 90B is disposed below the upper layer 90T. The lower layer 90B overlaps the upper layer 90T in plan view.

The upper layer 90T and the lower layer 90B each include a first transport mechanism 46, a second transport mechanism 48, a third transport mechanism 68, a first processing section 34, a second processing section 37, a third processing section 64, a first mount table 21, a second mount table 41, and a third mount table 51. The upper layer 90T and the lower layer 90B perform transportation of the substrate W and treatment to the substrate W simultaneously.

<Indexer 11>

Figure 14:
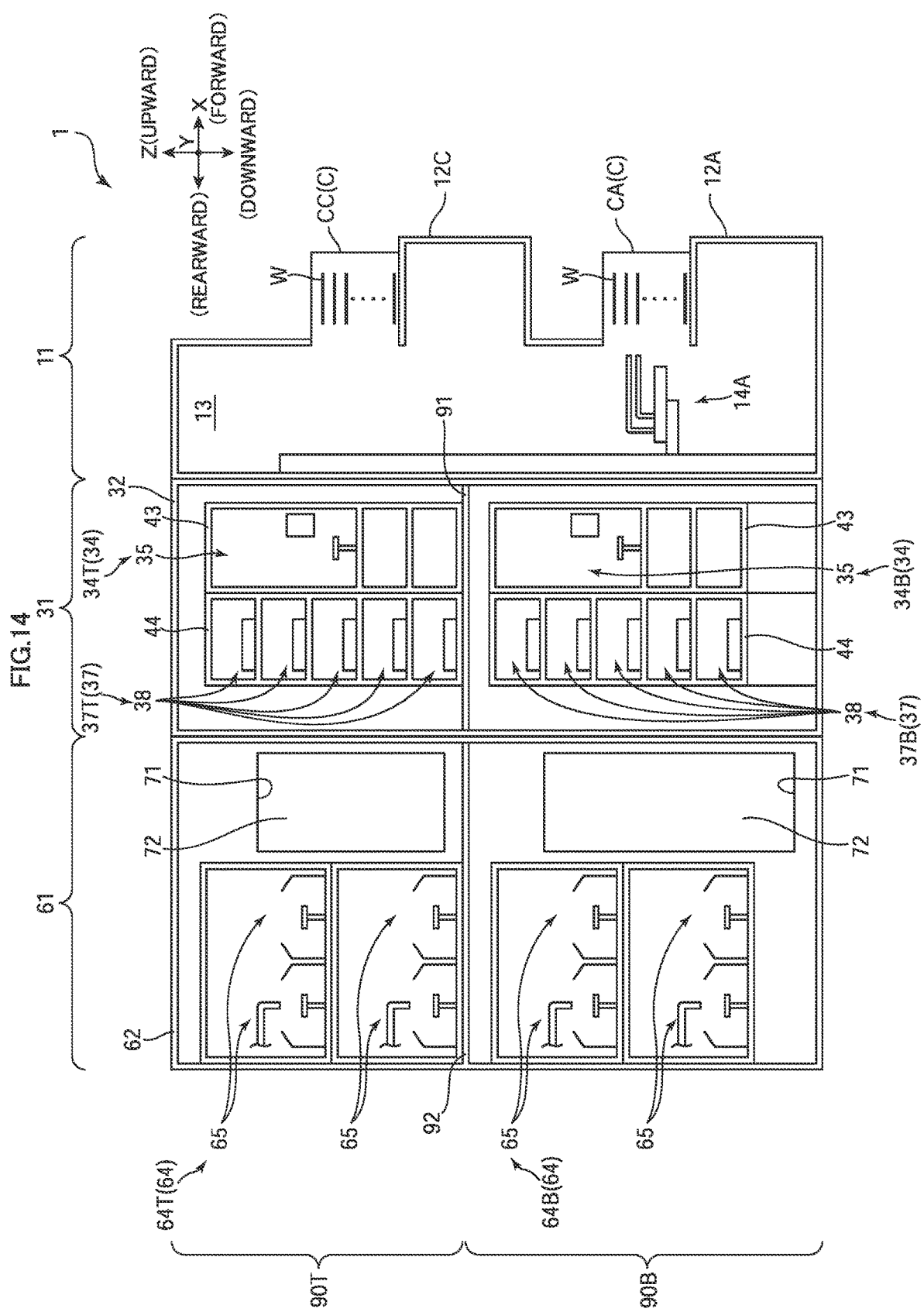
FIG. 14 is a right side view of a right portion of the substrate treating apparatus.

Reference is made to FIGS. 11A, 11B, 12, 13, and 14. FIG. 12 is a left side view of a left portion of the substrate treating apparatus 1. FIG. 13 is a left side view of a middle portion of the substrate treating apparatus 1 in the width direction Y. FIG. 14 is a right side view of a right portion of the substrate treating apparatus 1. The indexer block 11 includes carrier mount tables 12C, 12D in addition to the carrier mount tables 12A, 12B. The carrier mount table 12C is disposed above the carrier mount table 12A. The carrier mount table 12D is disposed above the carrier mount table 12B. The carrier mount tables 12C, 12D each have one carrier C placed thereon.

The carrier C placed on the carrier mount table 12C is referred to as a "carrier CC" appropriately. The carrier C placed on the carrier mount table 12D is referred to as a "carrier CD" appropriately.

The indexer transport mechanism 14A accesses the carriers CA, CC on the carrier mount tables 12A, 12C, respectively. The indexer transport mechanism 14B accesses the carriers CB, CD on the carrier mount tables 12B, 12D, respectively.

The indexer transport mechanism 14A illustrated in FIG. 11A is the same one as the indexer transport mechanism 14A illustrated in FIG. 11B. The indexer transport mechanism 14B illustrated in FIG. 11A is the same one as the indexer transport mechanism 14B illustrated in FIG. 11B.

<First Block 31>

Figure 15:
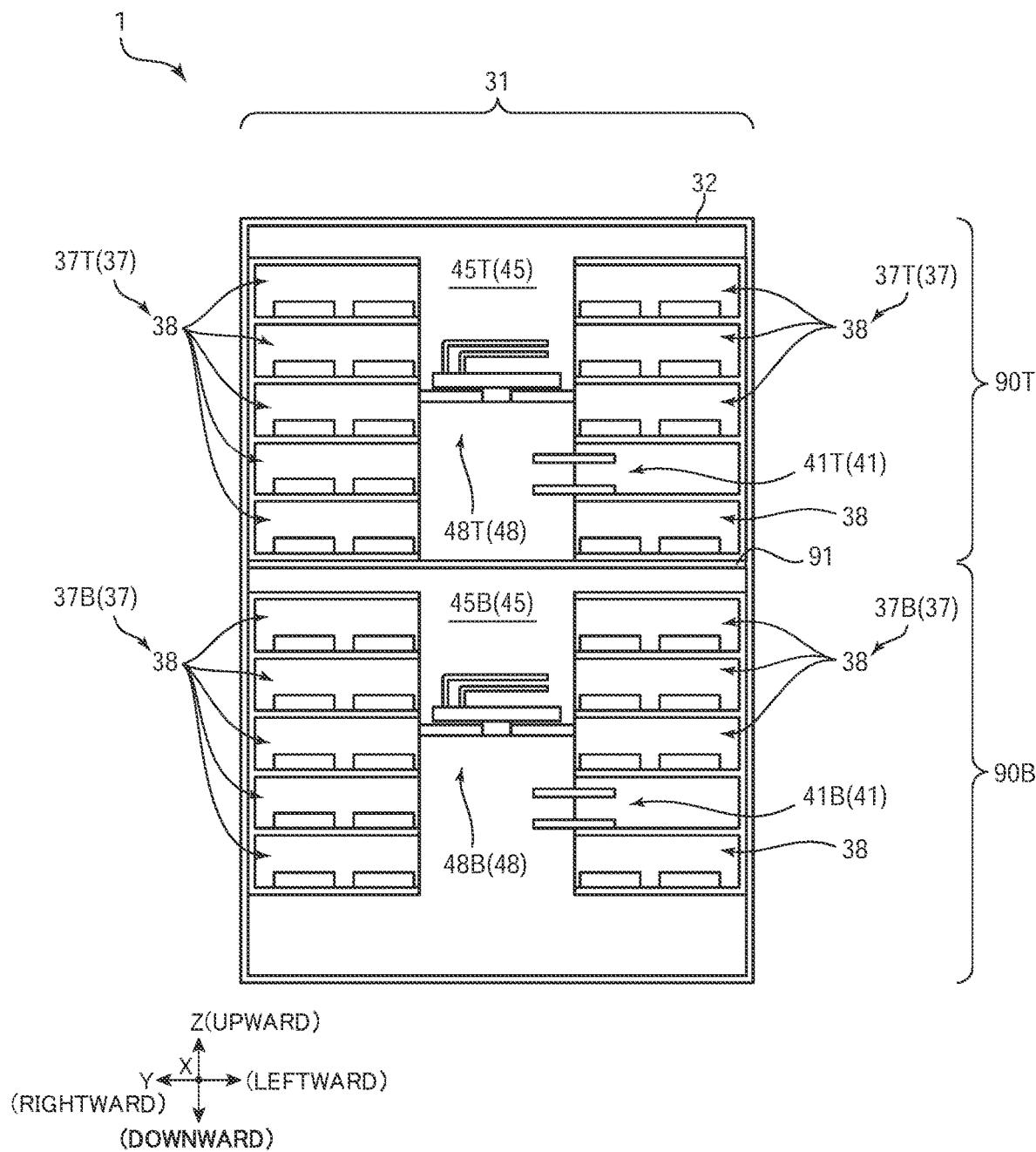
FIG. 15 is a front view of a first block.

Reference is made to FIGS. 11A, 11B, 12, 13, 14, and 15. FIG. 15 is a front view of the first block 31 (specifically, the second processing section 37 and the second transport mechanism 48). The substrate treating apparatus 1 includes two first transport mechanisms 46. The two first transport mechanisms 46 are arranged in the upward/downward direction Z. The upper one of the first transport mechanisms 46 is referred to as a "first upper transport mechanism 46T", whereas the lower one is referred to as a "first lower transport mechanism 46B".

The substrate treating apparatus 1 includes two second transport mechanisms 48. The two second transport mechanisms 48 are arranged in the upward/downward direction Z. The upper one of the second transport mechanisms 48 is referred to as a "second upper transport mechanism 48T", whereas the lower one is referred to as a "second lower transport mechanism 48B".

Reference is made to FIGS. 13 and 15. The substrate treating apparatus 1 further includes a partition 91. The partition 91 is disposed in the transportation space 45 of the first transportation block 31. The partition 91 has a flat plate shape. The partition 91 divides the transportation space 45 into an upper transportation space 45T and a lower transportation space 45B. The upper transportation space 45T is arranged above the lower transportation space 45B. The first upper transport mechanism 46T and the second upper transport mechanism 48T are disposed in the upper transportation space 45T. The first lower transport mechanism 46B and the second lower transport mechanism 48B are disposed in the lower transportation space 45B.

Reference is made to FIGS. 11A, 11B. The first processing section 34 is disposed laterally of the first upper transport mechanism 46T and the first lower transport mechanism 46B. The first processing section34 disposed laterally of the first upper transport mechanism 46T is referred to as a "first upper processing section 34T". The first processing section 34 disposed laterally of the first lower transport mechanism 46B is referred to as a "first lower processing section 34B".

The second processing section 37 is disposed laterally of the second upper transport mechanism 48T and the second lower transport mechanism 48B. The second processing section 37 disposed laterally of the second upper transport mechanism 48T is referred to as a "first upper processing section 37T". The second processing section 37 disposed laterally of the second lower transport mechanism 48B is referred to as a "second lower processing section 37B".

The second mount table 41 is disposed between the first upper transport mechanism 46T and the second upper transport mechanism 48T and between the first lower transport mechanism 46B and the second lower transport mechanism 48B. The first mount table 41 disposed between the first upper transport mechanism 46T and the second upper transport mechanism 48T is referred to as a "second upper mount table 41T". The second mount table 41 disposed between the first lower transport mechanism 46B and the second lower transport mechanism 48B is referred to as a "second lower mount table 41B".

Reference is made to FIGS. 12 and 14. The first upper processing section 34T is disposed above the partition 91. The first upper transport mechanism 46T accesses the first upper processing section 34T. The first lower processing section 34B is disposed below the partition 91. The first lower transport mechanism 46B accesses the first lower processing section 34B.

Reference is made to FIGS. 12, 14, and 15. The second upper processing section 37T is disposed above the partition 91. The second upper transport mechanism 48T accesses the second upper processing section 37T. The second lower processing section 37B is disposed below the partition 91. The second lower transport mechanism 48B accesses the second lower processing section 37B.

Reference is made to FIG. 15. The second upper mount table 41T is disposed above the partition 91. The first upper transport mechanism 46T and the second upper transport mechanism 48T access the second upper mount table 41T. The substrate W transported between the first upper transport mechanism 46T and the second upper transport mechanism 48T is placed on the second upper mount table 41T. The second lower mount table 41B is disposed below the partition 91. The first lower transport mechanism 46B and the second lower transport mechanism 48B access the second lower mount table 41B. The substrate W transported between the first lower transport mechanism 46B and the second lower transport mechanism 48B is placed on the second lower mount table 41B.

<Second Block 61>

Figure 16:
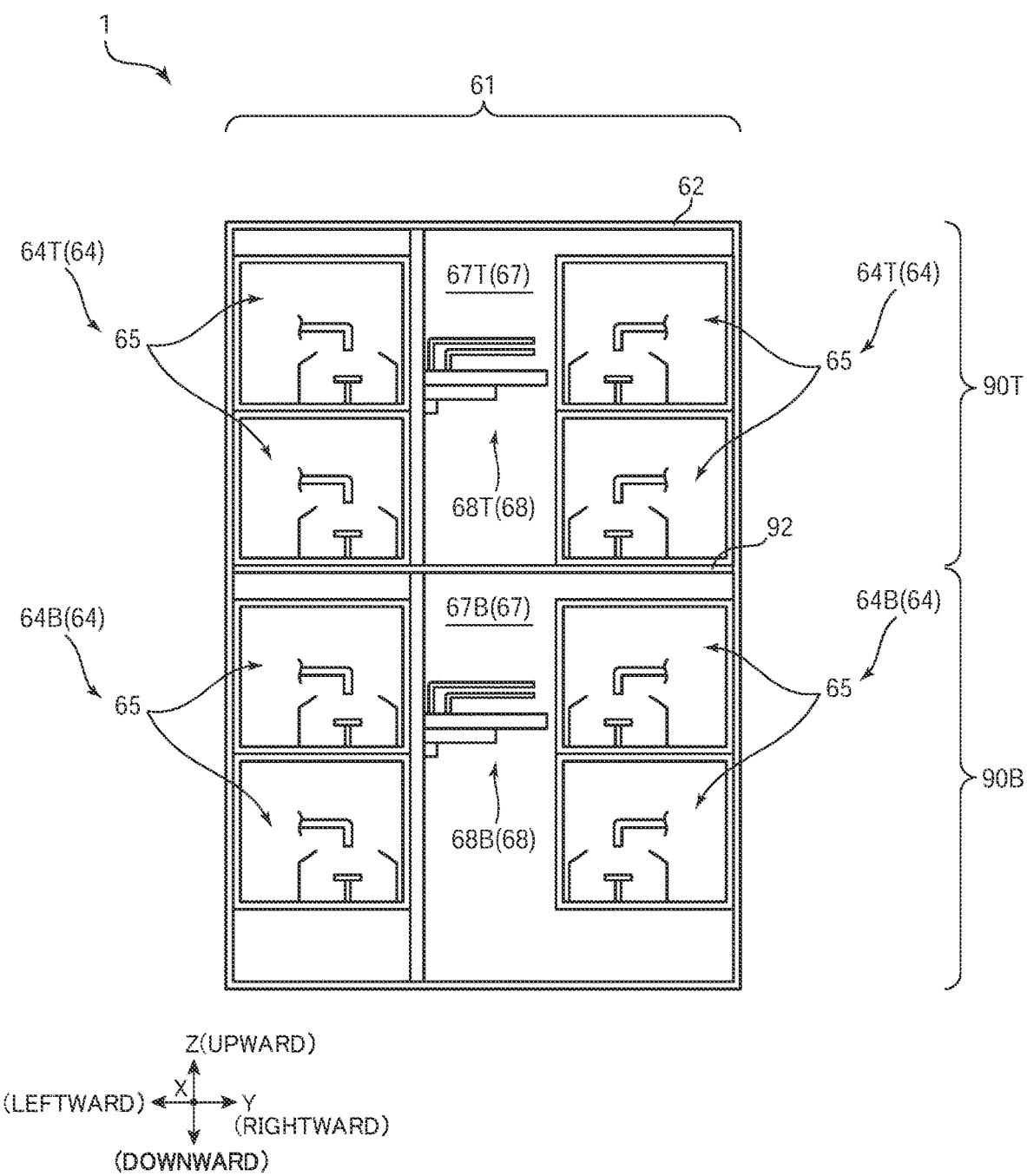
FIG. 16 is a rear view of a second block.

Reference is made to FIGS. 11A, 11B, 12, 13, 14, and 16. FIG. 16 is a rear view of a second block 61. The substrate treating apparatus 1 includes two third transport mechanisms 68. The two third transport mechanisms 68 are arranged in the upward/downward direction Z. The upper one of the third transport mechanisms 68 is referred to as a "third upper transport mechanism 68T", whereas the lower one is referred to as a "third lower transport mechanism 68B".

Reference is made to FIGS. 13 and 16. The substrate treating apparatus 1 further includes a partition 92. The partition 92 is disposed in the transportation space 67. The partition 92 has a flat plate shape. The partition 92 divides the transportation space 67 into an upper transportation space 67T and a lower transportation space 67B. The upper transportation space 67T is arranged above the lower transportation space 67B. The third upper transport mechanism 68T is disposed in the upper transportation space 67T. The third lower transport mechanism 68B is disposed in the lower transportation space 67B.

Reference is made to FIGS. 11A, 11B. The third processing section 64 is disposed laterally of the third upper transport mechanism 68T and the third lower transport mechanism 68B. The third processing section 64 disposed laterally of the third upper transport mechanism 68T is referred to as a "third upper processing section 64T". The third processing section 64 disposed laterally of the third lower transport mechanism 68B is referred to as a "third lower processing section 64B".

Reference is made to FIGS. 12, 14, and 16. The third upper processing section 64T is disposed above the partition 92. The third upper transport mechanism 68T accesses the third upper processing section 64T. The third lower processing section 64B is disposed below the partition 92. The third lower transport mechanism 68B accesses the third lower processing section 64B.

<First Mount Table 21>

Reference is made to FIGS. 11A, 11B. The first mount table 21 is disposed between the indexer 11 and the first upper transport mechanism 46T and between the indexer 11 and the first lower transport mechanism 46B. The first mount table 21 disposed between the indexer 11 and the first upper transport mechanism 46T is referred to as a "first upper mount table 21T". The first mount table 21 disposed between the indexer 11 and the first lower transport mechanism 46B is referred to as a "first lower mount table 21B".

The first upper mount table 21T is disposed across the transportation space 13 of the indexer 11 and an upper transportation space 45T of the first block 31. The lower first mount table 21B is disposed across the transportation space 13 of the indexer 11 and a lower transportation space 45B of the first block 31. The indexer transport mechanism 14A access the first upper mount table 21T and the first lower mount table 21B. The indexer transport mechanism 14B access the first upper mount table 21T and the first lower mount table 21B. The first upper transport mechanism 46T accesses the first upper mount table 21T. The first lower transport mechanism 46B accesses the first lower mount table 21B. The substrate W transported between the indexer 11 (i.e., the indexer transport mechanisms 14A, 14B) and the first upper transport mechanism 46T is placed on the first upper mount table 21T. The substrate W transported between the indexer 11 (i.e., the indexer transport mechanisms 14A, 14B) and the first lower transport mechanism 46B is placed on the first lower mount table 21B.

<Third Mount Table 51>

The third mount table 51 is disposed between the second upper transport mechanism 48T and the third upper transport mechanism 68T and between the second lower transport mechanism 48B and the third lower transport mechanism 68B. The third mount table 51 disposed between the second upper transport mechanism 48T and the third upper transport mechanism 68T is referred to as a "third upper mount table 51T". The third mount table 51 disposed between the second lower transport mechanism 48B and the third lower transport mechanism 68B is referred to as a "third lower mount table 51B". The third upper mount table 51T is disposed across the upper transportation space 45T of the first block 31 and the upper transportation space 67T of the second block 61. The third lower mount table 51B is disposed across the lower transportation space 45B of the first block 31 and the lower transportation space 67B of the second block 61. The second upper transport mechanism 48T and the third upper transport mechanism 68T access the third upper mount table 51T. The second lower transport mechanism 48B and the third lower transport mechanism 68B access the third lower mount table 51B. The substrate W transported between the second upper transport mechanism 48T and the third upper transport mechanism 68T is placed on the third upper mount table 51T. The substrate W transported between the second lower transport mechanism 48B and the third lower transport mechanism 68B is placed on the third lower mount table 51B.

The upper layer 90T includes the first upper transport mechanism 46T, the second upper transport mechanism 48T, the third upper transport mechanism 68T, the first upper mount table 21T, the second upper mount table 41T, the third upper mount table 51T, the first upper processing section 34T, the second upper processing section 37T, and the third upper processing section 64T. The lower layer 90B includes the first lower transport mechanism 46B, the second lower transport mechanism 48B, the third lower transport mechanism 68B, the first lower mount table 21B, the second lower mount table 41B, the third lower mount table 51B, the first lower processing section 34B, the second lower processing section 37B, and the third lower processing section 64B.

<Controller 81>

The controller 81 (see, for example, FIG. 1) controls the indexer 11, the first processing section 34, the first transport mechanism 46, the second processing section 37, the second transport mechanism 48, the third processing section 64, and the third transport mechanism 68.

<Cycle Operation by Individual Transport Mechanism>

Figure 17:
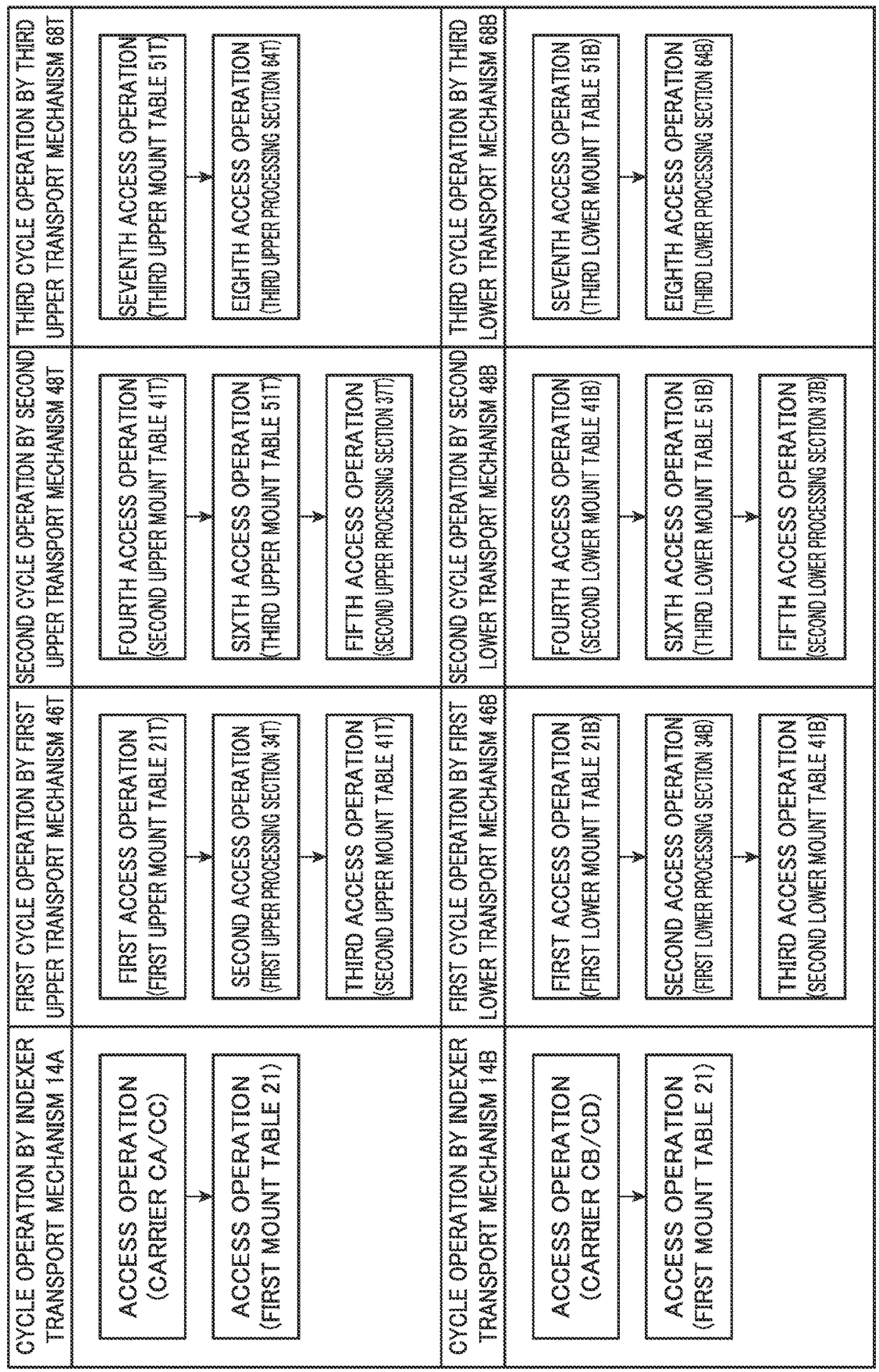
FIG. 17 schematically illustrates cycle operation by a transport mechanism.

FIG. 17 schematically illustrates cycle operation by a transport mechanism.

The indexer transport mechanism 14A repeatedly performs the cycle operation constituted by the following two access operations.

Access operation to carriers CA, CC
Access operation to first mount table 21 (first upper mount table 21T and first lower mount table 21B)

The indexer transport mechanism 14B repeatedly performs the cycle operation constituted by the following two access operations.

Access operation to carriers CB, CD
Access operation to first mount table 21 (first upper mount table 21T and first lower mount table 21B)

The first upper transport mechanism 46T repeatedly performs the first cycle operation constituted by the following three access operations.

First access operation of accessing the first upper mount table 21T
Second access operation of accessing the first upper processing section 34T
Third access operation of accessing the second upper mount table 41T The first lower transport mechanism 46B repeatedly performs the first cycle operation constituted by the following three access operations.

First access operation of accessing the first lower mount table 21B
Second access operation of accessing the first lower processing section 34B
Third access operation of accessing the second lower mount table 41B The second upper transport mechanism 48T repeatedly performs the second cycle operation constituted by the following three access operations.

Fourth access operation of accessing the second upper mount table 41T
Fifth access operation of accessing the second upper processing section 37T
Sixth access operation of accessing the third upper mount table 51T The second lower transport mechanism 48B repeatedly performs the second cycle operation constituted by the following three access operations.

Fourth access operation of accessing the second lower mount table 41B
Fifth access operation of accessing the second lower processing section 37B
Sixth access operation of accessing the third lower mount table 51B The third upper transport mechanism 68T repeatedly performs the third cycle operation constituted by the following two access operations.

Seventh access operation of accessing the third upper mount table 51T
Eighth access operation of accessing the third upper processing section 64T The third lower transport mechanism 68B repeatedly performs the third cycle operation constituted by the following two access operations.

Seventh access operation of accessing the third lower mount table 51B
Eighth access operation of accessing the third lower processing section 64B <Operational Example>

Figure 18:
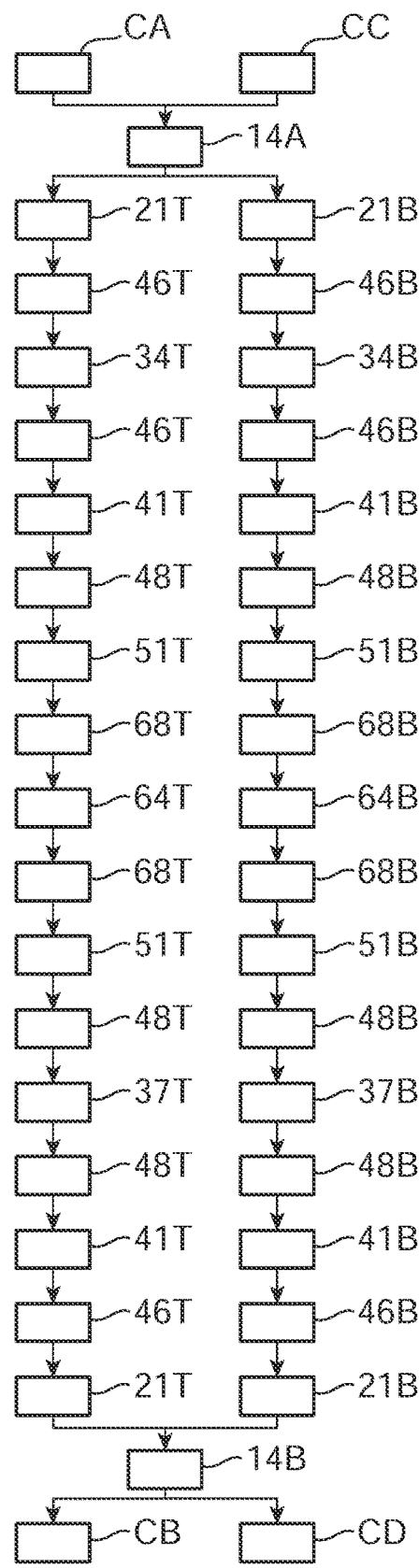
FIG. 18 schematically illustrates a transportation path of the substrate.

FIG. 18 schematically illustrates a transportation path of the substrate. The substrate treating apparatus 1 operates as under.

<Operation (1) of Indexer 11>

The indexer 11 transports the substrate W to the first upper mount table 21T and the first lower mount table 21B alternately.

Specifically, in one cycle operation of the indexer transport mechanism 14A, the indexer transport mechanism 14A unloads the substrate W from either the carrier CA or CC, and places the substrate W onto the first upper mount table 21T. In the subsequent cycle operation by the indexer transport mechanism 14A, the indexer transport mechanism 14A unloads the substrate W from either the carrier CA or CC, and places the substrate W onto the first lower mount table 21B.

<Operation of First Block 31 and Second Block 61>

The operation in the upper layer 90T is similar to the operation in the lower layer 90B. Accordingly, description is made firstly of the operation in the upper layer 90T, and description about the operation in the lower layer 90B is to be omitted. When the following description is replaced with a description of the lower layer 90B, the wording of the first to third upper transport mechanisms 46T, 48T, 68T is changed into the first to third lower transport mechanisms 46B, 48B, 68B, respectively, the wording of the first to third upper mount tables 21T, 41T, 51T is changed into the first to third lower mount tables 21B, 41B, 51B, and the wording of the first to third upper processing sections 34T, 37T, 64T is changed into the first to third lower processing sections 34B, 37B, 64B, respectively.

The first upper transport mechanism 46T picks up the substrate W on the first upper mount table 21T (first access operation). The first upper transport mechanism 46T loads the substrate W into the first upper processing section 34T (second access operation). The first upper processing section 34T performs treatment (edge exposure treatment) to the substrate W. The first upper transport mechanism 46T unloads the substrate W from the first upper processing section 34T (second access operation). The first upper transport mechanism 46T places the substrate W onto the second upper mount table 41T (third access operation).

The second upper transport mechanism 48T picks up the substrate W on the second upper mount table 41T (fourth access operation). The second upper transport mechanism 48T places the substrate W onto the third upper mount table 51T (sixth access operation).

The third upper transport mechanism 68T picks up the substrate W on the third upper mount table 51T (seventh access operation). The third upper transport mechanism 68T loads the substrate W into the third upper processing section 64T (eighth access operation). The third upper processing section 64T performs treatment (liquid treatment) to the substrate W. The third upper transport mechanism 68T unloads the substrate W from the third upper processing section 64T (eighth access operation). The third upper transport mechanism 68T places the substrate W onto the third upper mount table 51T (seventh access operation).

The second upper transport mechanism 48T picks up the substrate W on the third upper mount table 51T (sixth access operation). The second upper transport mechanism 48T loads the substrate W into the second upper processing section 37T (fifth access operation). The second upper processing section 37T performs treatment (heat treatment) to the substrate W. The second upper transport mechanism 48T unloads the substrate W from the second upper processing section 37T (fifth access operation). The second upper transport mechanism 48T places the substrate W onto the second upper mount table 41T (fourth access operation).

The first upper transport mechanism 46T picks up the substrate W on the second upper mount table 41T (third access operation). The first upper transport mechanism 46T places the substrate W onto the first upper mount table 21T (first access operation).

<Operation (2) of Indexer 11>

The indexer 11 picks up the substrate W from the first upper mount table 21T and the first lower mount table 21B alternately.

Specifically, in one cycle operation of the indexer transport mechanism 14B, the indexer transport mechanism 14B picks up the substrate W on the first upper mount table 21T, and loads the substrate W onto either the carrier CB or CD. In the subsequent cycle operation by the indexer transport mechanism 14B, the indexer transport mechanism 14B picks up the substrate W on the first lower mount table 21B, and loads the substrate W into either the carrier CB or CD.

<Effect of Second Embodiment>

A second achieves the same effect as that of the first embodiment. For instance, the first cycle operation by the first transport mechanism 46 (46T, 46B) is composed of three access operations. The second cycle operation by the second transport mechanism 48 (48T, 48B) is composed of three access operations. The third cycle operation by the third transport mechanism 68 (68T, 68B) is composed of two access operations. This achieves suitably enhanced throughput of the substrate treating apparatus 1.

The second mount table 41 (41T, 41B) includes the first portion 41a overlapped on the first processing section 34 (34T, 34B) in plan view, and the second portion 41b overlapped on the second processing section 37 (37T, 37B) in plan view. Accordingly, the distance between the first transport mechanism 46 and the second transport mechanism 48 can be reduced. Moreover, the first transport mechanism 46 and the second transport mechanism 48 each allow easy access to the second mount table 41.

Moreover, the second embodiment produces the following effect. The two first transport mechanisms 46 (46T, 46B) are disposed in association with the first processing section 34. The two second transport mechanisms 48 (48T, 48B) are disposed in association with the second processing section 37. The two third transport mechanisms 68 (68T, 68B) are disposed in association with the third processing section 64. This achieves doubled throughput of the substrate treating apparatus 1.

The first upper transport mechanism 46T and the first lower transport mechanism 46B are arranged in the upward/downward direction Z. Therefore, this achieves suitable prevention of increase in installation area (footprint) of the substrate treating apparatus 1.

The second upper transport mechanism 48T and the second lower transport mechanism 48B are arranged in the upward/downward direction Z. Therefore, this achieves suitable prevention of increase in installation area (footprint) of the substrate treating apparatus 1.

The third upper transport mechanism 68T and the third lower transport mechanism 68B are arranged in the upward/downward direction Z. Therefore, this achieves suitable prevention of increase in installation area (footprint) of the substrate treating apparatus 1.

The upper layer 90T and the lower layer 90B are arranged in the upward/downward direction Z. Therefore, this achieves suitable prevention of increase in installation area (footprint) of the substrate treating apparatus 1.

The present invention is not limited to the foregoing examples, but may be modified as follows.

(1) In the first and second embodiments described above, the second mount table 41 is positioned so as not to overlap the virtual line L connecting the first axis A1 and the second axis A2 in plan view. However, this is not limitative. The second mount table 41 may be positioned so as to overlap the virtual line L connecting the first axis A1 and the second axis A2 in plan view.

Figure 19:
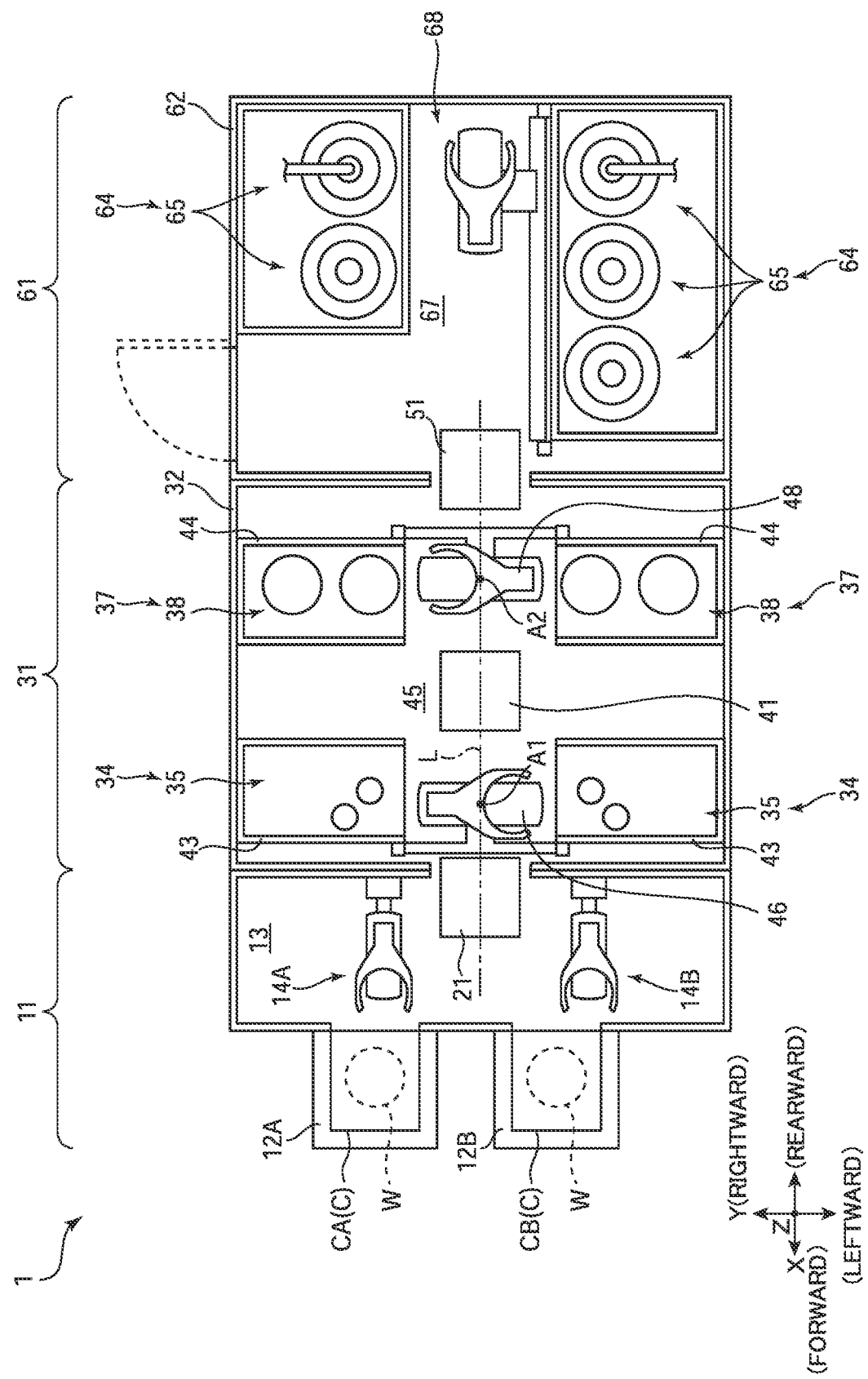
FIG. 19 is a plan view of the substrate treating apparatus according to one modification.

FIG. 19 is a plan view of a substrate treating apparatus 1 according to one modification. Like numerals are used to identify like components which are the same as that in the first embodiment, and the components will not particularly be described. The second mount table 41 is positioned so as not to overlap the first processing section 34. The second mount table 41 is positioned so as not to overlap the second processing section 37. The second mount table 41 is entirely disposed in the transportation space 45. The second mount table 41 is positioned so as to overlap the virtual line L connecting the first axis A1 and the second axis A2 in plan view. The first transport mechanism 46, the second mount table 41, and the second transport mechanism 48 are disposed in line in the forward/rearward direction X.

(2) In the first and second embodiments described above, the number of processing sections is three (specifically, the first to third processing sections 34, 37, 64). However, this is not limitative. For instance, the number of processing sections may be two. For instance, the number of processing sections may be four or more.

For instance, the third mount table 51 is omittable when the third processing section 64 is omitted. Furthermore, the sixth access operation is omittable. As a result, the second cycle operation by the second transport mechanism 48 is composed of two access operations. In other words, the number of access operations included in the second cycle operation is two. Specifically, the two access operations included in the second cycle operation is as under:

Fourth access operation of accessing the second mount table 41

Fifth access operation of accessing the second processing section 37

(3) In the first and second embodiments described above, the substrate treating apparatus 1 is not connected to the exposing machine that exposes the substrate W to light. However, this is not limitative. For instance, the exposing machine may be connected to the substrate treating apparatus 1.

For instance, the exposing machine may be connected to a rear part of the second block 61. In such a case, the substrate treating apparatus 1 may include a fourth mount table on which the substrate W transported between the third transport mechanism 68 and the exposing machine is placed. In this modification, the third transport mechanism 68B repeatedly performs the third cycle operation constituted by the following three access operations.

Seventh access operation of accessing the third mount table 51
Eighth access operation of accessing the third processing section 64
Ninth access operation of accessing the fourth mount table In this modification, the number of access operations included in the third cycle operation is three. Accordingly, still-high transportation efficiency by the third transport mechanism 68 is obtainable. This achieves enhanced throughput of the substrate treating apparatus 1.

Alternatively, the third transport mechanism 68 may transport the substrate W to the exposing machine directly. In this modification, the third transport mechanism 68B repeatedly performs the third cycle operation constituted by the following three access operations.

Seventh access operation of accessing the third mount table 51
Eighth access operation of accessing the third processing section 64
Ninth access operation of accessing the exposing machine In this modification, the number of access operations included in the third cycle operation is three. Accordingly, still-high transportation efficiency by the third transport mechanism 68 is obtainable. This achieves enhanced throughput of the substrate treating apparatus 1.

(4) In the first and second embodiments described above, the substrate treating apparatus 1 includes no interface configured to transport the substrate W to the exposing machine. However, this is not limitative. The substrate treating apparatus 1 may include an interface.

For instance, the interface may be connected to a rear part of the second block 61. In such a case, the substrate treating apparatus 1 may include a fourth mount table on which the substrate W transported between the third transport mechanism 68 and the interface is placed. In this modification, the third transport mechanism 68B repeatedly performs the third cycle operation constituted by the following three access operations.

Seventh access operation of accessing the third mount table 51
Eighth access operation of accessing the third processing section 64
Ninth access operation of accessing the fourth mount table In this modification, the number of access operations included in the third cycle operation is three. Accordingly, still-high transportation efficiency by the third transport mechanism 68 is obtainable. This achieves enhanced throughput of the substrate treating apparatus 1.

(5) In the first and second embodiments described above, the first processing section 34 corresponds to the edge exposing section, and the second processing section 37 corresponds to the heat treating section. However, this is not limitative. The first processing section 34 may be the heat treating section. The second processing section may be the edge exposing section.

In the first and second embodiments described above, the first processing unit 35 corresponds to the edge exposing unit, and the second processing unit 38 corresponds to the heat treating unit. However, this is not limitative. The first processing units 35 may be the heat treating unit. The second processing units 38 may be the edge exposure treating unit.

(6) In the first and second embodiments described above, the liquid treatment performed by the third processing section 64 is a developing process. However, this is not limitative. The liquid treatment performed by the third processing section 64 may be a coating treatment. The coating treatment is treatment made by coating the substrate W with a coating material to form a coating film on the substrate W. Here, the coating film is, for example, a resist film or an antireflection film. The liquid treatment performed by the third processing section 64 may be a cleaning treatment, for example. The cleaning treatment is a treatment that supplies a cleaning liquid to the substrate W.

(7) In the first embodiment described above, the first transport mechanism 46 includes the two first struts 47a, 47b. However, this is not limitative. For instance, one of the first struts 47a, 47b is omittable. Likewise, in the first embodiment described above, the second transport mechanism 48 includes the two second struts 49a, 49b. However, this is not limitative. For instance, one of the second struts 49a, 49b is omittable.

(8) In the first and second embodiments described above, the first processing section 34 is disposed rightward and leftward of the transportation space 45. However, this is not limitative. For instance, the first processing section 34 may be disposed either rightward or leftward of the transportation space 45. Likewise, such modification is applicable to the second processing section 37 and the third processing section 64.

(9) In the first and second embodiments described above, the second processing unit 38 may further includes a temperature regulator that is attached to the first plate 39a and regulates a temperature of the first plate 39a. For instance, the first plate 39a may regulate the temperature of the substrate W. For instance, the first plate 39a may cool the substrate W heated by the second plate 39b.

Alternatively, the second processing unit 38 may include a temperature regulator that is attached to the local transport mechanism and regulates a temperature of the local transport mechanism. For instance, the local transport mechanism may regulate the temperature of the substrate W. For instance, the local transport mechanism may cool the substrate W heated by the second plate 39b.

(10) In the first and second embodiments described above, the second mount table 41 is positioned so as to overlap the first left processing section 34L and the second left processing section 37L in plan view. However, this is not limitative. The second mount table 41 may be positioned so as to overlap the first right processing section 34R and the second right processing section 37R in plan view.

(11) In the first and second embodiments described above, the space F is arranged forward of the third right processing section 64R. However, this is not limitative. The space F may be disposed rearward of the third right processing section 64R. The space F may be disposed forward and rearward of the third right processing section 64R.

(12) In the first and second embodiments described above, the third right processing section 64R has the length G1 in the forward/rearward direction X that is smaller than the length G2 of the third left processing section 64L in the forward/rearward direction X. However, this is not limitative. The length G2 may be smaller than the length G1. In this modification, the third right processing section 64R corresponds to one example of the third long processing section. The third left processing section 64L corresponds to one example of the third short processing section in the present invention. In this modification, the space F and the third left processing section 64L are arranged in the forward/rearward direction X. In this modification, the arrangement of the space F is variable appropriately.

(13) In the first embodiment described above, operation of the indexer 11 is not described in detail. The following describes in detail operation of the indexer 11. For instance, the indexer 11 may unload the substrate W from the carrier CA mounted on the carrier mount table 12A and loading the substrate W into the carrier CB mounted on the carrier mount table 12B. In this case, the carrier CA on the carrier mount table 12A may be transported to the carrier mount table 12B after all the substrates W in the carrier CA on the carrier mount table 12A are unloaded. The indexer 11 does not necessarily load the substrates W into the carrier CA on the carrier mount table 12A. The indexer 11 does not necessarily unload the substrates W from the carrier CB on the carrier mount table 12B.

(14) The elements of the present embodiments and the modifications as described in the above (1) to (13) may be variably combined appropriately.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus, comprising:
    an indexer that unloads a substrate from a carrier;
    a first processing section that performs treatment to the substrate;
    a first transport mechanism that transports the substrate to the first processing section;
    a second processing section that performs treatment, different from the treatment by the first processing section, to the substrate;
    a second transport mechanism that transports the substrate to the second processing section;
    a first mount table on which the substrate transported between the indexer and the first transport mechanism is placed;
    a second mount table on which the substrate transported between the first transport mechanism and the second transport mechanism is placed; and
    a controller that performs control of the indexer, the first processing section, the first transport mechanism, the second processing section and the second transport mechanism,
    the first transport mechanism repeatedly performing first cycle operation composed of three access operations in accordance with the control by the controller,
    one of the access operations in the first cycle operation being a first access operation of accessing the first mount table,
    another of the access operations in the first cycle operation being a second access operation of accessing the first processing section,
    the other of the access operations in the first cycle operation being a third access operation of accessing the second mount table,
    the second transport mechanism repeatedly performing second cycle operation composed of two or three access operations in accordance with the control by the controller,
    one of the access operations in the second cycle operation being a fourth access operation of accessing the second mount table, and
    another of the access operations in the second cycle operation being a fifth access operation of accessing the second processing section, wherein
    the first mount table is disposed between the indexer and the first transport mechanism,
    the second mount table is disposed between the first transport mechanism and the second transport mechanism,
    the first processing section is disposed laterally of the first transport mechanism,
    the second processing section is disposed laterally of the second transport mechanism, and
    the first transport mechanism, the second transport mechanism, and the second mount table are arranged in a triangle shape in plan view.

2. The substrate treating apparatus according to claim 1, wherein
    the first access operation includes operation by the first transport mechanism of picking up the substrate on the first mount table, and placing the substrate onto the first mount table,
    the second access operation includes operation by the first transport mechanism of loading the substrate into the first processing section, and unloading the substrate from the first processing section,
    the third access operation includes operation by the first transport mechanism of picking up the substrate on the second mount table, and placing the substrate onto the second mount table, and
    the fourth access operation includes operation by the second transport mechanism of picking up the substrate on the second mount table, and placing the substrate onto the second mount table, and
    the fifth access operation includes operation by the second transport mechanism of loading the substrate into the second processing section, and unloading the substrate from the second processing section.

3. The substrate treating apparatus according to claim 1, wherein
    the first processing section is disposed out of a second area where the second transport mechanism is capable of transporting the substrate, and
    the second processing section is disposed out of a first area where the first transport mechanism is capable of transporting the substrate.

4. The substrate treating apparatus according to claim 3, wherein
    the first area is circular in plan view, and
    the second area is circular in plan view.

5. The substrate treating apparatus according to claim 1, further comprising:
    a plurality of first slots that are arranged laterally of the first transport mechanism in line in an upward/downward direction, and
    a plurality of second slots that are arranged laterally of the second transport mechanism in line in the upward/downward direction, wherein
    at least one of the first slots is a first treatment slot for arranging the first processing section, another of the first slots is a first mounting slot for arranging the second mount table,
at least one of the second slots is a second treatment slot for arranging the second processing section,
another of the second slots is a second mounting slot for arranging the second mount table,
the second mounting slot is disposed at a level equal to that of the first mounting slot, and
the second mount table is arranged over the first mounting slot and the second mounting slot.

6. A substrate treating apparatus, comprising:
an indexer that unloads a substrate from a carrier;
a first processing section that performs treatment to the substrate;
a first transport mechanism that transports the substrate to the first processing section;
a second processing section that performs treatment, different from the treatment by the first processing section, to the substrate;
a second transport mechanism that transports the substrate to the second processing section;
a first mount table on which the substrate transported between the indexer and the first transport mechanism is placed;
a second mount table on which the substrate transported between the first transport mechanism and the second transport mechanism is placed; and
a controller that performs control of the indexer, the first processing section, the first transport mechanism, the second processing section and the second transport mechanism,
the first transport mechanism repeatedly performing first cycle operation composed of three access operations in accordance with the control by the controller,
one of the access operations in the first cycle operation being a first access operation of accessing the first mount table,
another of the access operations in the first cycle operation being a second access operation of accessing the first processing section,
the other of the access operations in the first cycle operation being a third access operation of accessing the second mount table,
the second transport mechanism repeatedly performing second cycle operation composed of two or three access operations in accordance with the control by the controller,
one of the access operations in the second cycle operation being a fourth access operation of accessing the second mount table, and
another of the access operations in the second cycle operation being a fifth access operation of accessing the second processing section, wherein
the first mount table is disposed between the indexer and the first transport mechanism,
the second mount table is disposed between the first transport mechanism and the second transport mechanism,
the first processing section is disposed laterally of the first transport mechanism,
the second processing section is disposed laterally of the second transport mechanism,
the first transport mechanism includes:
  a first strut that is fixedly arranged and extends in an upward/downward direction;
  a first lifting member that is supported on the first strut and is movable in the upward/downward direction;
  a first rotator that is supported on the first lifting member and is rotatable around a first axis parallel to the upward/downward direction; and
  a first holder that is supported on the first rotator and holds the substrate,
the first rotator is immovable in a horizontal direction,
the first processing section includes a plurality of first treating units that performs treatment to each of the substrates,
the first processing units being positioned so as to overlap the first axis in side view,
the second transport mechanism includes:
  a second strut that is fixedly arranged and extends in the upward/downward direction;
  a second lifting member that is supported on the second strut and is movable in the upward/downward direction;
  a second rotator that is supported on the second lifting member and is rotatable around a second axis parallel to the upward/downward direction; and
  a second holder that is supported on the second rotator and holds the substrate,
the second rotator is immovable in the horizontal direction,
the second processing section includes a plurality of second processing units that performs treatment to each of the substrates,
the second processing units being positioned so as to overlap the second axis in side view, and
the second mount table is positioned so as not to overlap a virtual line that connects the first axis to the second axis in plan view.

7. The substrate treating apparatus according to claim 6, wherein
either the first processing units or the second processing units are heat treating units for performing a heat treatment to the substrates, and
the heat treating units are arranged in the upward/downward direction.

8. The substrate treating apparatus according to claim 6, wherein
a distance between the first axis and the second axis is five times or less a radius of the substrate in plan view.

9. The substrate treating apparatus according to claim 6, wherein
a distance between the first axis and the second mount table is equal to a distance between the second axis and the second mount table in plan view.

10. A substrate treating apparatus, comprising:
an indexer that unloads a substrate from a carrier;
a first processing section that performs treatment to the substrate;
a first transport mechanism that transports the substrate to the first processing section;
a second processing section that performs treatment, different from the treatment by the first processing section, to the substrate;
a second transport mechanism that transports the substrate to the second processing section;
a first mount table on which the substrate transported between the indexer and the first transport mechanism is placed;
a second mount table on which the substrate transported between the first transport mechanism and the second transport mechanism is placed; and a controller that performs control of the indexer, the first processing section, the first transport mechanism, the second processing section and the second transport mechanism, the first transport mechanism repeatedly performing first cycle operation composed of three access operations in accordance with the control by the controller, one of the access operations in the first cycle operation being a first access operation of accessing the first mount table, another of the access operations in the first cycle operation being a second access operation of accessing the first processing section, the other of the access operations in the first cycle operation being a third access operation of accessing the second mount table, the second transport mechanism repeatedly performing second cycle operation composed of two or three access operations in accordance with the control by the controller, one of the access operations in the second cycle operation being a fourth access operation of accessing the second mount table, and another of the access operations in the second cycle operation being a fifth access operation of accessing the second processing section, wherein the second mount table includes:
  a first portion overlapped on the first processing section in plan view; and
  a second portion overlapped on the second processing section in plan view, and the second mount table further includes a third portion not overlapped on the first processing section and the second processing section in plan view.

11. The substrate treating apparatus according to claim 10, wherein
  the third portion of the second mount table is overlapped in plan view on a transportation space where the first and second transport mechanisms are arranged.

12. A substrate treating apparatus, comprising:
an indexer that unloads a substrate from a carrier;
a first processing section that performs treatment to the substrate;
a first transport mechanism that transports the substrate to the first processing section;
a second processing section that performs treatment, different from the treatment by the first processing section, to the substrate;
a second transport mechanism that transports the substrate to the second processing section;
a first mount table on which the substrate transported between the indexer and the first transport mechanism is placed;
a second mount table on which the substrate transported between the first transport mechanism and the second transport mechanism is placed; and
a controller that performs control of the indexer, the first processing section, the first transport mechanism, the second processing section and the second transport mechanism,
the first transport mechanism repeatedly performing first cycle operation composed of three access operations in accordance with the control by the controller,
one of the access operations in the first cycle operation being a first access operation of accessing the first mount table,
another of the access operations in the first cycle operation being a second access operation of accessing the first processing section,
the other of the access operations in the first cycle operation being a third access operation of accessing the second mount table,
the second transport mechanism repeatedly performing second cycle operation composed of two or three access operations in accordance with the control by the controller,
one of the access operations in the second cycle operation being a fourth access operation of accessing the second mount table, and
another of the access operations in the second cycle operation being a fifth access operation of accessing the second processing section, wherein
the substrate treating apparatus further comprises:
  a third processing section that performs treatment, different from the treatment by the first processing section and the treatment by the second processing section, to the substrate;
  a third transport mechanism that transports the substrate to the third processing section; and
  a third mount table on which the substrate transported between the second transport mechanism and the third transport mechanism is placed, wherein
the controller performs additional control of the third processing section and the third transport mechanism,
the second cycle operation is composed of three access operations,
rest one of the access operations in the second cycle operation other than the fourth access operation and the fifth access operation is a sixth access operation of accessing the third mount table,
the third transport mechanism repeatedly performs the third cycle operation composed of two or three access operations in accordance with the control by the controller,
one of the access operations in the third cycle operation is a seventh access operation of accessing the third mount table,
another of the access operations in the third cycle operation is an eighth access operation of accessing the third processing section,
the substrate treating apparatus further comprises a maintenance space,
the third processing section includes:
  a third long processing section and;
  a third short processing section,
the third transport mechanism is disposed between the third long processing section and the third short processing section,
the third long processing section, the third transport mechanism, and the third short processing section are arranged in a width direction,
the third short processing section has a length in a forward/rearward direction perpendicular to the width direction that is shorter than a length of the third long processing section in the forward/backward direction, and
the maintenance space and the third short processing section are arranged in the forward/backward direction.

13. The substrate treating apparatus according to claim 12, wherein
the sixth access operation includes operation by the second transport mechanism of picking up the substrate on the third mount table, and placing the substrate onto the third mount table,
the seventh access operation includes operation by the third transport mechanism of picking up the substrate on the third mount table, and placing the substrate onto the third mount table, and
the eighth access operation includes operation by the third transport mechanism of loading the substrate into the third processing section, and unloading the substrate from the third processing section.

14. The substrate treating apparatus according to claim 12, wherein
one of the first processing section and the second processing section corresponds to an edge exposing section that exposes a peripheral edge of the substrate to light,
the other of the first processing section and the second processing section corresponds a heat treating section that performs a heat treatment to the substrate, and
the third processing section corresponds to a liquid treating section that performs a liquid treatment to the substrate.

15. The substrate treating apparatus according to claim 14, wherein
the first transport mechanism, the second transport mechanism, and the third transport mechanism transport the substrate, supplied from the indexer, to the edge exposing section, the liquid treating section, and the heat treating section, in this order, in accordance with the control by the controller, and
the first transport mechanism and the second transport mechanism transport the substrate, unloaded from the heat treating section, back to the indexer without delivering the substrate to the third transport mechanism in accordance with the control by the controller.

16. The substrate treating apparatus according to claim 14, further comprising:
a heat insulation space for separating the third processing section from the second processing section.

17. The substrate treating apparatus according to claim 12, further comprising:
a first block accommodating the first processing section, the first transport mechanism, the second processing section, the second transport mechanism, and the second mount table, and
a second block connected to the first block and accommodating the third processing section and the third transport mechanism,
the first block being substantially rectangular in front view, in plan view and in side view, and
the second block being substantially rectangular in front view, in plan view and in side view.

18. The substrate treating apparatus according to claim 17, further comprising:
a first frame provided as a framework of the first block, and a second frame provided as a framework of the second block,
the first frame supporting the first transport mechanism, the second transport mechanism, the first processing section, the second processing section, and the second mount table, and
the second frame supporting the third transport mechanism and the third processing section, wherein
the second frame is coupled to the first frame.

* * * * *